United States Patent
Aue et al.

(10) Patent No.: US 10,224,642 B2
(45) Date of Patent: Mar. 5, 2019

(54) MODULAR ANTENNA SYSTEM

(71) Applicant: AIRRAYS GMBH, Dresden (DE)

(72) Inventors: Volker Aue, Dresden (DE); Michael Grieger, Dresden (DE); Albrecht Fehske, Dresden (DE)

(73) Assignee: AIRRAYS GMBH, Dresden (DE)

( * ) Notice: Subject to any disclaimer, the term of this patent is extended or adjusted under 35 U.S.C. 154(b) by 17 days.

(21) Appl. No.: 15/311,367

(22) PCT Filed: Jun. 4, 2015

(86) PCT No.: PCT/EP2015/062491
§ 371 (c)(1),
(2) Date: Nov. 15, 2016

(87) PCT Pub. No.: WO2015/185680
PCT Pub. Date: Dec. 10, 2015

(65) Prior Publication Data
US 2017/0085005 A1    Mar. 23, 2017

(30) Foreign Application Priority Data

Jun. 3, 2014 (EP) ................................ 14001916
Dec. 12, 2014 (DE) .................... 10 2014 118 529
Dec. 12, 2014 (DE) .................... 10 2014 118 539

(51) Int. Cl.
*H04M 1/00* (2006.01)
*H01Q 21/00* (2006.01)
(Continued)

(52) U.S. Cl.
CPC ......... *H01Q 21/0025* (2013.01); *H01Q 1/246* (2013.01); *H01Q 19/00* (2013.01);
(Continued)

(58) Field of Classification Search
CPC .......... H04B 1/40; H01Q 1/246; H01Q 19/00; H01Q 21/061; H01Q 21/24
See application file for complete search history.

(56) References Cited

U.S. PATENT DOCUMENTS 8,760,353 B2   6/2014 Wei et al.
8,774,196 B2 *   7/2014 Schmidt ............... H04B 7/0682
                                                                342/383
(Continued)

FOREIGN PATENT DOCUMENTS

CN         103594823 A     2/2014
EP           2044784 B1     1/2012
(Continued)

OTHER PUBLICATIONS

International Search Report and Written Opinion issued in PCT/EP2015/062491, dated Aug. 27, 2015.
(Continued)

*Primary Examiner* — Tuan Pham
(74) *Attorney, Agent, or Firm* — Heslin Rothenberg Farley & Mesiti P.C.

(57) ABSTRACT

A modular antenna system and a method for signal processing using the modular antenna system are provided to overcome the missing scalability of conventional antenna arrays and improve the overall antenna array performance as well as facilitate individually replacing defective or not reliably operating radio-units or radio-subunits in modular antenna array systems and provide a calibration procedure which can be adapted to a scalable antenna array. The modular antenna system includes a base station, and at least one radio-unit comprising at least two radio-subunits. Each radio-subunit includes a radio-module and an antenna-module. The radio-module includes a digital signal-processing unit, at least a transceiver, a front-end and a power amplifier. The radio-subunits provide an identical architecture and are modularly connected together via a connector interface and each radio-subunit has an own IQ-input and an own IQ-output.

15 Claims, 19 Drawing Sheets

Figure 1:
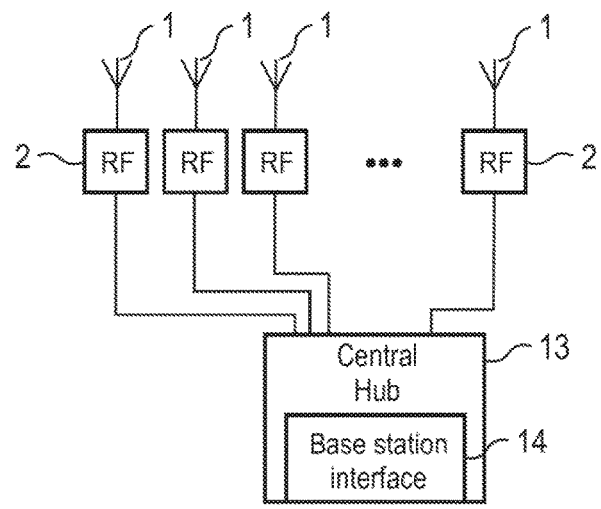

(51) Int. Cl.

| | | |
|---|---|---|
| *H04B 1/40* | (2015.01) | |
| *H01Q 1/24* | (2006.01) | |
| *H01Q 21/06* | (2006.01) | |
| *H01Q 19/00* | (2006.01) | |
| *H01Q 21/24* | (2006.01) | |
| *H03F 3/24* | (2006.01) | |
| *H04B 7/06* | (2006.01) | |
| *H04B 17/12* | (2015.01) | |
| *H04B 1/04* | (2006.01) | |

(52) U.S. Cl.
CPC ........... *H01Q 21/061* (2013.01); *H01Q 21/24* (2013.01); *H03F 3/24* (2013.01); *H04B 1/40* (2013.01); *H04B 7/0617* (2013.01); *H04B 17/12* (2015.01); *H04B 2001/0408* (2013.01)

(56) References Cited

U.S. PATENT DOCUMENTS

| | | |
|---|---|---|
| 2002/0126062 A1 | 9/2002 | Matthews |
| 2009/0245228 A1 | 10/2009 | Osterling |
| 2013/0120191 A1 | 5/2013 | Zhang et al. |
| 2014/0073337 A1* | 3/2014 | Hong .................... H04W 16/28 455/452.1 |

FOREIGN PATENT DOCUMENTS

| | | |
|---|---|---|
| EP | 2485562 A1 | 8/2012 |
| EP | 2270923 B1 | 4/2013 |
| EP | 2713436 A1 | 4/2014 |
| WO | 2010060953 A1 | 6/2010 |
| WO | 2010075865 A1 | 7/2010 |
| WO | 2013026204 A1 | 2/2013 |
| WO | 2013091581 A1 | 6/2013 |
| WO | 2013112443 A1 | 8/2013 |
| WO | 2013123907 A1 | 8/2013 |
| WO | 2013123913 A1 | 8/2013 |
| WO | 2014048350 A1 | 4/2014 |

OTHER PUBLICATIONS

"CPRI Specification V2.0 (Oct. 1, 2004)," Internet Citation, Retrieved from the Internet: http://www.cpri.online (retrieved on Dec. 15, 2005).

* cited by examiner

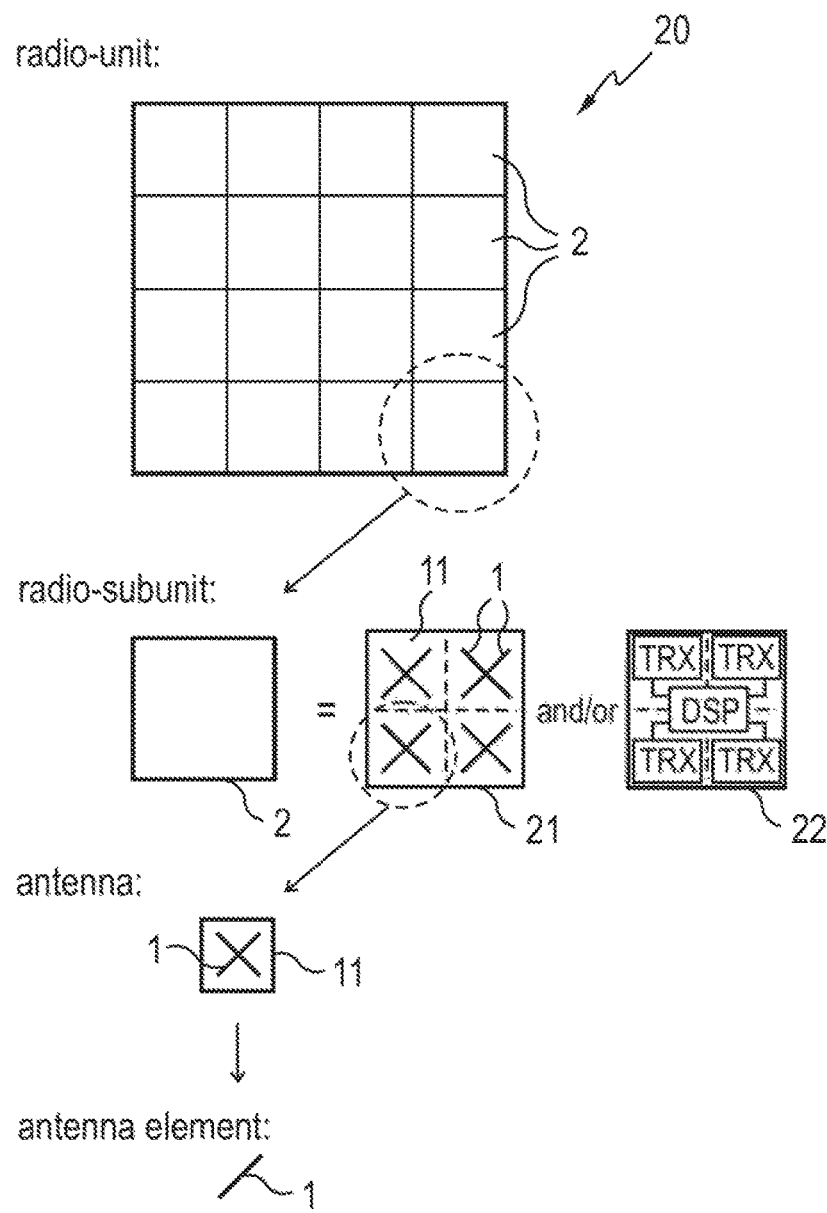

MODULAR ANTENNA SYSTEM

CROSS REFERENCE TO RELATED APPLICATIONS

This application is the National Phase filing under 35 U.S.C. § 371 of International Application No. PCT/EP2015/062491, filed on Jun. 4, 2015, and published on Dec. 10, 2015 as WO/2015/185680 A1, and claims priority to German application numbers 10 2014 118 539.0 and 10 2014 118 529.3 both filed on Dec. 12, 2014 and to European patent application number 14001916.7 filed on Jun. 4, 2014. The contents of each of the prior applications are hereby incorporated by reference herein in their entirety.

FIELD OF THE INVENTION

The present invention provides a modular antenna system and a method for signal processing using the said modular antenna system.

BACKGROUND OF THE INVENTION AND STATE OF THE ART

Adaptive antenna arrays have been well known for years. Instead of making use of a single antenna to transmit or receive a signal, multiple antenna elements are used that are arranged in some geometrical order. This arrangement is typically referred to as an antenna array. For transmission, a signal to be transmitted is presented to all antenna elements of the antenna array. By carefully controlling the amplitude and phase of the signal presented to each antenna, the radiation pattern of the array is influenced. This is achieved because the radiated signals of all antenna elements overlap in the far field, leading to constructive or destructive interference depending on their phase. Likewise, signals received at the antenna elements are superimposed after adapting the phase and amplitude to adapt the reception pattern of the array.

The main advantage of adaptive antenna arrays is that antenna patterns can be formed electronically. One possible application is the so-called beam forming, i.e., creating patterns with a high gain towards a specific direction. By controlling the signal phases at the individual antennas, the beam can be steered towards a target receiver or transmitter and it can also be used to track the target.

Large scale antenna systems (LSAS) are seen as a means for increasing spectral efficiency in upcoming 5G cellular networks. An introduction can be found in "4G Americas' Recommendation on 5G Requirements and Solutions, http://www.4gamericas.org/doc uments/4G%20Americas%20Recommendations%20on%205G%20Requirements%20and%20So lutions_10%2014%202014-FINALx.pdf".

Antenna configurations with two or more antennas are called Multiple Input Multiple Output (MIMO). In massive Multiple Input Multiple Output (MIMO) systems, very large numbers of antennas are employed at the base station. This number may be larger than the number of active users in the cell or devices in the "internet of things". The antennas can be used in transmit or receive direction. Using duplex filters, the antennas can be used to transmit and receive, simultaneously.

Massive MIMO systems are an evolution step from active antenna systems. In the $4^{th}$ generation (4G) active antennas typically contain up to 16 antenna elements each of which may have its own power amplifier. In a massive MIMO system, the number of antenna elements may be much larger, and parts of the signal processing, which in conventional systems is performed at the base stations, may be shifted to the massive MIMO antenna.

FIG. 1 shows a simplified drawing of a conventional architecture for active antennas. Each antenna element 1 is connected to a radio-subunit 2.

For simple active antennas, the radio-subunit 2 may consist of a duplex filter and a phase shifter. In the most advanced and flexible approach the phase shifting is done in the central hub in the digital baseband domain. In this case, the radio-subunit 2 consists of digital-to-analog converters and a transceiver, power amplifiers and filters. The radio-subunits 2 are all connected to a central hub 13. When beamforming is performed digitally, the central hub 13 has multiple tasks:

a) perform Rx beamforming,
    b) perform Tx beamforming,
    c) perform calibration of amplitude, phases, and sample latencies among the radio-subunits 2, and
    d) distribute clock to the radio-subunits 2.

Figure 2:
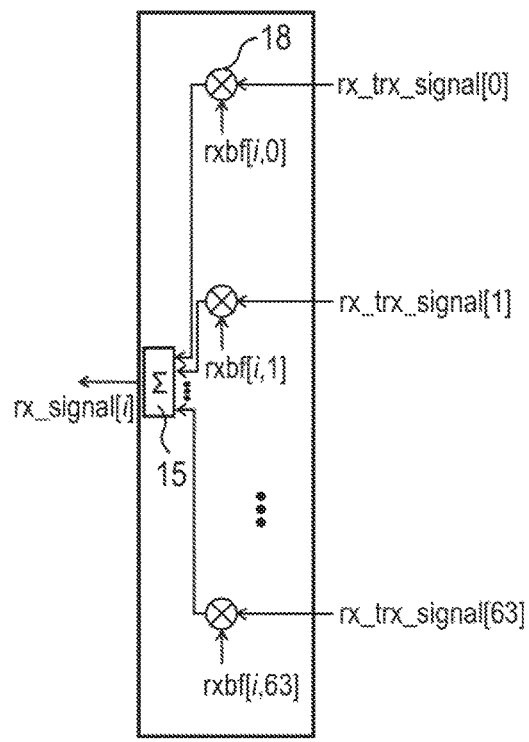

Digital beamforming possesses the advantage that multiple beams can be formed simultaneously. That is, in receive direction, all Rx signals are individually weighted and then added 15 together to produce a combined signal. This is illustrated in FIG. 2 for an antenna system employing 64 receive antennas. In this antenna system, the 64 receive signals coming from the 64 transceivers are each individually weighted, by multiplying 18 each signal j, $0 \leq j \leq 63$, with a complex weight rxbf[i,j]. The weighted signals are then added 15 together to form the receive signal rx_signal[j]. In the digital domain, this procedure can be carried out in parallel using different weights to calculate multiple weighted rx_signals i.

Figure 3:
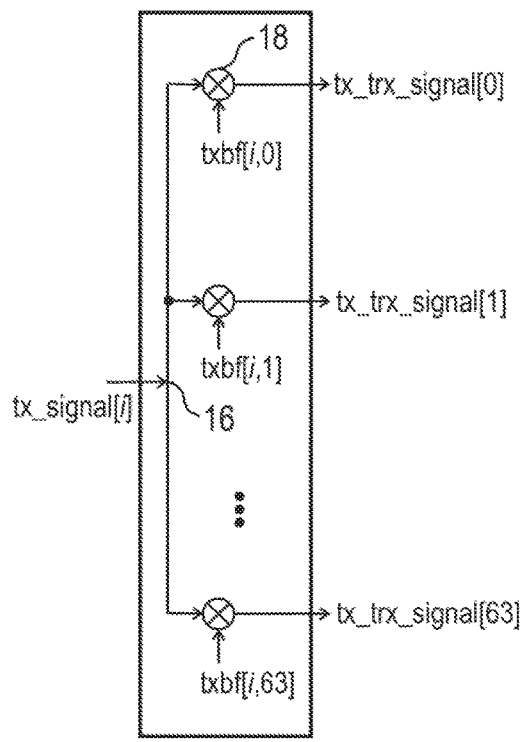

In Tx direction, the same signal tx_signal[i] is distributed to branches that connect to the antenna elements 1. In each branch j, the tx_signal[i] 16 is multiplied 18 with a complex weight txbf[i,j]. In the digital domain, this procedure can be carried out in parallel using different weights to calculate multiple weighted tx_signals i to form multiple beams at the same time. This is illustrated in FIG. 3.

The main disadvantage of solutions using the conventional architecture is primarily the missing scalability. The conventional architecture is based on a central hub 13 as shown in FIG. 1 to perform signal processing and to distribute the processed signals. This conventional architecture is limited in performance and scalability due to the following reasons:

Pins: Each radio-subunit needs to be connected to the central hub. The more radio-subunits are used, the more connections are needed. Typically, a central hub is based on a field programmable gate array (FPGA). The number of pins an FPGA provides is limited. Thus, if the number of connections requires more connections than the FPGA provides, a different design is needed.
    Scalability: It may be desired that the dimensions of the antenna array (number of radio-subunits) should be adapted to a particular use case. Using the same central hub which is preferred in order to reduce engineering and production costs, for each configuration results in the using an oversized hub for smaller antenna arrays.
    Computational power of the central hub: The computational requirements of the central hub scale with the number of antenna elements. For large scale antenna systems (LSAS), the computational complexity may as well exceed the computational complexity that the FPGA provides.

Cost: Even if the computational complexity for the central hub increases linearly with the number of antenna elements, the cost for the FPGA does not. Larger FPGAs tend to be more expensive than two smaller FPGAs with the same combined number of logic elements.

Power consumption and heat dissipation: Not only the required FPGA size increases with the number of antenna elements, but also the power consumption due to the increased number of computations required. Using one central FPGA, heat is generated at a concentrated heat source, which complicates the precautions to be taken for cooling.

Cable and wiring: For a LSAS, if a central hub is used, wiring and connections become a challenge. The cables need to become longer to connect the antenna elements that are furthest away from the central hub. As cables get longer, the challenge to guarantee signal integrity such as slew rate and signal strength increases.

Calibration of the antenna elements: Calibrating the amplitude, phases and sample latencies is necessary for controlling the transmitted and received signals at antenna elements and among the radio-subunits.

So far, only parts of the necessary calibration procedures like the correction of amplitude and phases among the antenna elements were considered in the prior art. WO2010060953 A1 considers the generation of a PN calibration sequence as well as correlation for estimation of phase and amplitude. But the estimation of a delay and correction of this delay is not presented, similarly to U.S. Pat. No. 8,374,826 B2.

EP 2044784 B1 discloses a very basic architecture of a remote base station via fiber to an antenna array system whereas all radio-subunits are connected to a central hub. An unlimited scalability is not possible with that configuration.

Another drawback in the prior art is the inconvenience of active antenna maintenance.

An active antenna for digital wireless communication systems such as UMTS, LTE, etc. consists of four major functional parts: the digital signal processing, the analog (RF) signal processing, the interface to the base station and the array of antenna elements.

Compared to a conventional analog antenna system, the integration of active components may result in higher failure rates (reduced mean time between failure (MTBF)) and, hence, in increased efforts required to maintain and repair the device. On the other hand, the combination of digital and analog (RF) signal processing and an array antenna provides additional features and degrees of freedom, given that the device can be configured through an appropriate data interface. The maintenance process typically has the following stages:
1. Monitoring the proper function of the device and detecting errors;
2. Ad-hoc measures for mitigating the impact of an error occurred;
3. Repair or replace a defect device;
4. Reintegrate the device to reestablish original network functions.

One may distinguish the repair of hardware components, which requires physical access to the device from repair of software components (or updates), which can be done remotely through an appropriate data interface. Monitoring of hardware components may be done remotely as well, provided that appropriate measurements can be taken and that information on these measurements can be exchanged through an appropriate data interface. Once a problem occurs, the state of the art assumes antennas to be monolithic blocks. As a consequence, a technician either needs to identify a particular defect and repair it on site, or the complete antenna has to be replaced entirely. The task of the innovation is to reduce the efforts required for repairing a malfunctioning device. This concerns the localization of the malfunctioning component within the antenna system, and replacing the malfunctioning component on site.

It has not yet succeeded in the prior art to overcome the following drawbacks, namely that errors can be localized easily. Often erroneous components, such as FPGAs, power amplifiers, etc. cannot be replaced on site. Thus, the antenna has to be replaced, and the defect antenna needs to be repaired in a workshop that has the appropriate tools available.

But an active antenna may consist out of many modules. In case one module fails, it is desirable to replace a single unit (on site) instead of having to replace the entire active antenna. The units are connected through interfaces. In prior art, the active antenna array is either built as a monolithic structure or out of several units that are connected.

For example, in WO2013123907 A1 and WO2013123913 A1 a modular active antenna is described where each module is contained in an individual radome. WO2013112443 A1 also describes a modular antenna but does not provide a solution for maintenance of the modular array. Easy installation may be more complicated due to the additional wire used as a calibration antenna. U.S. Pat. No. 8,760,353 B2 also uses pieces to have an array that can be maintained easily. However, the solution does not need any connection between the modules. Thus, it only works if the processing is done centrally. WO 2014048350 A1 discloses an antenna which is easy to maintain and install. However, the antenna array as such is not build in a modular way. EP2713436 A1 or WO2013026204 A1 describes a modular structure where active and passive components are built on different modules which can be replaced separately. This approach has the disadvantage that logic elements cannot be separated and that long wires are required to connect the active and the passive components. WO 2013091581 A1 presents a modular antenna array in chain architecture. The modules are not directly connected. Thus, in order to remove any particular module, one would have to disconnect the individual modules. EP 2270923 B1 considers the calibration of a modular array. But it does not know a solution to replace individual modules without having to dissemble the entire antenna, especially, if any module in the center is the one to be replaced.

Problems

One object of the invention is to overcome the problems mentioned above, namely, the missing scalability of conventional antenna arrays.

It is also an object of the invention to reduce the need of long wiring associated with reduced variability of the latencies between the many antenna elements and therefore an improvement of the overall antenna array performance at all.

Another object of the invention is to introduce a possibility for individually replacing defect or not reliably operating radio-units or radio-subunits in antenna array systems without dissemble the entire antenna system, especially, if any radio-subunit in the center is the one that has to be replaced.

It is also an object of the invention to provide a calibration procedure for scalable modular antenna array.

DETAILED DESCRIPTION OF THE INVENTION

The objects of the invention are achieved by a modular antenna system comprising at least one radio-unit comprising at least two radio-subunits, each radio-subunit comprising a radio-module and/or an antenna-module whereas said radio-module comprising a digital signal-processing unit, at least a transceiver, a front-end and a power amplifier, wherein the at least two radio-subunits provide an identical architecture and are mutually connected via a connector interface, and each radio-subunit has an IQ-input and an IQ-output.

Figure 4B:
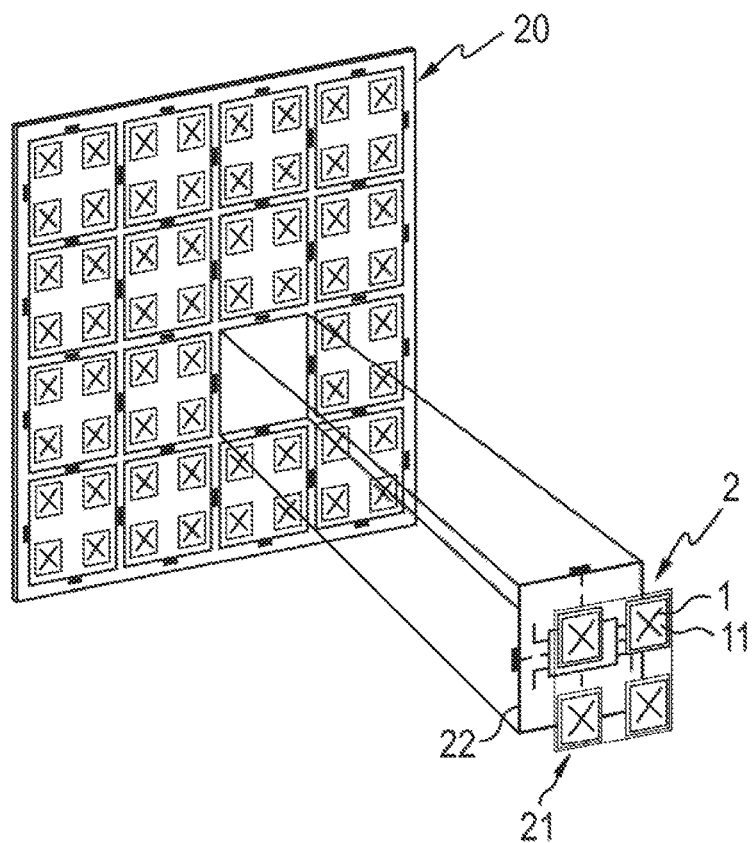
Figure 4C:
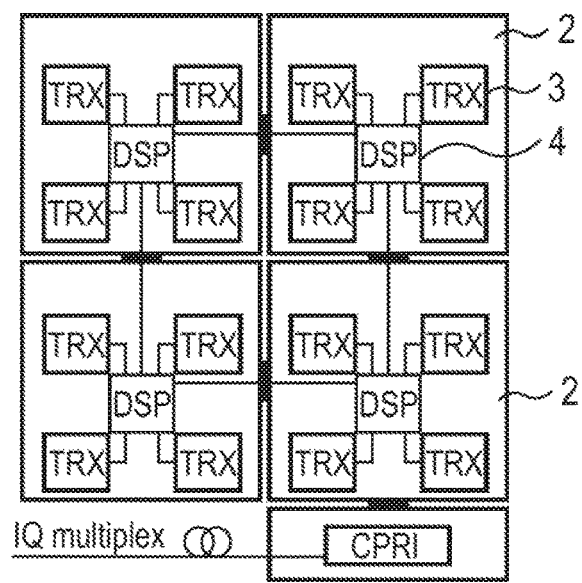

For illustrating purposes, but without any loss of generality FIG. 4a shows some components and their relation to each other in order to use unified terms for describing the present invention. FIGS. 4b and 4c illustrate the modular architecture of the present invention in greater detail. FIG. 4b shows the radio-unit 20 with radio-subunits 2 and FIG. 4c shows four radio-subunits 2 illustrating the signaling processing on the radio-module 22.

A radio-unit 20 comprises at least two radio-subunits 2, preferred multiple radio-subunits. These radio-subunits can be individually arranged, for example in a 4×4 array, meaning that sixteen radio-subunits are arranged in four rows and four columns or they can be arranged in a 8×2 array, meaning that sixteen radio-subunits are arranged in two rows and eight columns or eight rows and two columns. Several radio-units in an antenna system will be used to cover different frequency bands.

A radio-subunit 2 is a part of a radio-unit 20. Each radio-subunit comprises a radio-module 22 and an antenna-module 21, whereas the radio-module 22 and the antenna-module 21 are positioned and stacked over each other. Therefore, the wiring and the signal paths between the antennas with the antenna elements of the antenna module and the signal processing on the radio-module, which is defined below, is very short. Alternatively, the antennas may be directly mounted on the radio-module and thus be part of the radio-module.

A radio-module 22 comprises a digital signal-processing unit, a transceiver, one for every antenna element and a front-end consisting of power amplifiers, filters, diplexers, mixers and so forth. The mentioned components are located on a printed circuit board (PCB). The wiring for connecting the components is inside the PCB, whereas the connector interfaces are located at the edge of the PCB for easy access. Necessary calibration procedures will be partly performed on the radio-module.

An antenna-module comprises several antennas whereas one antenna may consist of two antenna elements. A joint processing of the signals provided to the antenna elements arranged in an antenna array on the antenna-module are used for beam forming, interference mitigation in transmit direction and interference avoidance in receive direction.

In another embodiment, the radio-module and the antenna-module are integrated, e.g., on the same PCB.

All radio-subunits are based on the same architecture. Therefore, they can be modularly connected together via an appropriate connector interface. Due to the identical architecture, radio-subunits are exchangeable, e.g., to replace a malfunctioning radio-subunit. Scalability of the antenna system is achieved, because the radio-subunits can be connected in every conceivable position and number.

The radio-subunits have also an identical memory map with different base addresses. Each micro-controller can address all registers and memories of all radio-subunits in the radio-unit. This is important for inter-radio-subunit-communication, debug and boot procedures. In one embodiment up to 256 radio-subunits can be supported.

Because of the separated IQ-input and IQ-output of each radio-subunit, partial Rx beam forming in receive direction and partial Tx beam forming in transmit direction can be performed individually and in parallel for each radio-subunit.

Figure 5:
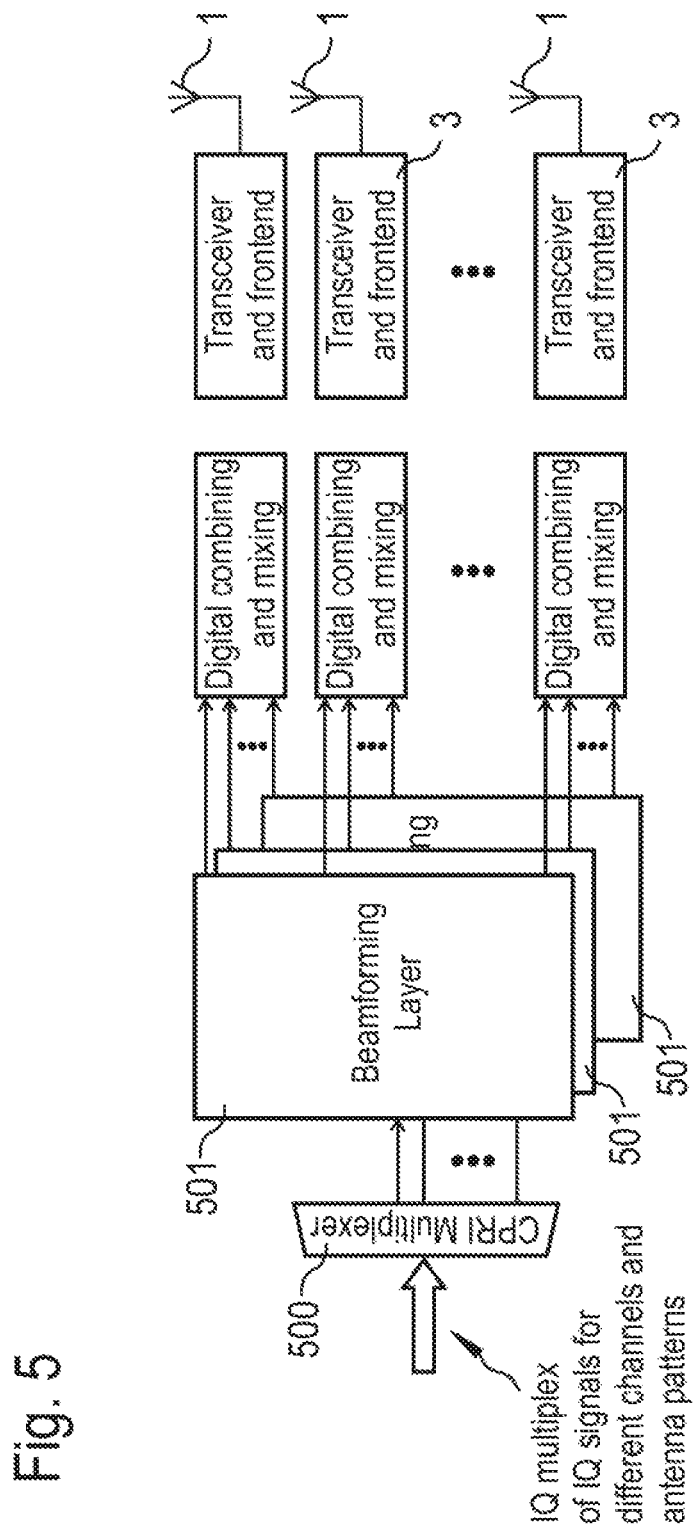

In one embodiment of the invention the IQ-inputs and the IQ-outputs of each radio-subunit are connected to a base station. IQ stands for the in-phase and quadrature part of a signal. The connection can be an optical connection realized by an optical transceiver and an optical cable. For example, the optical cable carries eight IQ streams received from the eight antenna elements and are guided to the base station. The benefit of such a configuration is that the IQ stream of each single transceiver that is connected with one antenna element is accessible by the base station. IQ stands for the in-phase and quadrature part of a signal. In transmit direction multiple IQ signals are multiplexed by a CPRI multiplexer 500 for different channels and antenna patterns to the beamforming layers 501. From each beamforming layer 501 the signals are digitally combined and mixed and transferred to the transceiver 3 and front-end of each individual antenna element 1. Therefore, individual antenna patterns per channel can be performed. Up to 24 IQ streams and an arbitrary assignment of IQ streams to the channels are possible. This is illustrated in FIG. 5.

Furthermore, this embodiment can be used for a general LSAS radio-unit 3000. One requirement is that each transceiver's IQ stream should be accessible by the base station. Therefore, each radio-subunit 2 has the option to be populated with an optical transceiver cage 3001. Each optical link carries eight IQ streams, namely form four cross-polarized antennas, whereas one antenna consists of two antenna elements. In a general LSAS radio-unit 1 GTX per optical transceiver and 1 GTX per radio-subunit 2 interconnect is available for calibration purposes. This is exemplarily shown in FIG. 30.

In a preferred embodiment, the IQ-input and the IQ-output of the radio-subunit is connected to at least one adjacent radio-subunit and the IQ-input and the IQ-output of a root-radio-subunit is connected to the base station via IQ-signal lines. The IQ-signal lines can be realized by optical cables or via electrical connections. In this embodiment there is only one connection to the base station, namely the connection of the root-radio-subunit. The other radio-subunits of the radio-unit communicate with the base station over the connector interfaces of the adjacent radio-subunits. In receive direction the IQ stream that consists of the IQ signals of the antenna elements of a radio-subunit is passed from one adjacent and connected radio-subunit to another until the serialized and multiplexed IQ streams can be transferred from the root-radio-subunit to the base station. Of course this is also possible in transmit direction: The multiplexed IQ signals will be transmitted from the base station to the root-radio-subunit. From there the signal is further transmitted from one adjacent radio-subunit to the other radio-subunit until the last radio-subunit of the hierarchical order in the radio-unit is reached.

In one embodiment of the invention an interface-subunit (ISU) is connected to the root-radio-subunit. The ISU can be part of the radio-unit. The ISU is responsible to provide a high level command interface, for example for XML-encoded messages, and it is a means to adapt and convert customer specific interfaces to the RSU-interface protocol. Therefore the interfaces of modular built RSUs are independent from the customer interfaces. Only the ISU has to be adapted to the customer's specification. The ISU can also provide a web interface, remote configuration, test signal generation, wireless local area network connection, and additional connectors for example optical interfaces. But also the root-radio-subunit can possess these features and can communicate with the base station.

In another embodiment the radio-subunit is combined with optically active elements. The modular antenna system allows for building very thin panels. One application of those panels can be to integrate them into walls of buildings or to integrate them into illuminated signs. In this case, the modules can be equipped with strong light emitting diodes (LEDs). The radome then is designed to be translucent towards visible light. It may also be designed as a diffusor to first guide the light from the LEDs to the surface and then distribute the light evenly.

In another embodiment, the LEDs are controlled in brightness and color by a controller function that is part of the radio-subunit's FPGA. The control information is IP mapped, where the IP control channel is part of the CPRI protocol. The IP packets are conveyed to the radio-subunit.

Yet in another embodiment, multiple radio-subunits combined as a radio-unit are used to display changing patterns, pictograms or images.

The scalability of the dimension of antenna arrays is based on and provided by the modular architecture of the radio-subunits. In one embodiment of the hierarchical modular architecture, the radio-subunit is connected to exactly one parent-radio-subunit and to n child-radio-subunits, with n≥0. That means none child-radio-subunit, one or more child-radio-subunits, for example three child-radio-subunits can be connected to the radio-subunit. The number is not limited to the physical connectors. Also a connection through the backplane is possible. A radio-subunit is called a parent-radio-subunit with respect to another radio-subunit if the radio-subunit is positioned one hierarchical level above the other radio-subunit and these radio-subunits are connected. The other way round, a radio-subunit is called a child-radio-subunit with respect to another radio-subunit if the radio-subunit is positioned one hierarchical level under the other radio-subunit and these radio-subunits are connected.

Depending on the hierarchical position of the radio-subunit in the radio-unit, the radio-subunit supports different configurations:

a) the root-radio-subunit (RSU-R) provides an interface to the base station and can be connected up to three child-radio-subunits or, short, children. It is positioned in a first level of the hierarchical architecture of the radio-unit. Except for the connection to the base station or to an optical ISU, the root-radio-subunit is identical to the node-radio-subunit, explained in the following.

b) a node-radio-subunit (RSU-N) provides interfaces to the root-RSU or to a parent-radio-subunit and can connect up to three children. A RSU-N is always positioned at least one level under the root-RSU, it can never be positioned in the first level, because it is not directly connected to the base station.

c) a branch-radio-subunit (RSU-B) provides an interface to the parent-radio-subunit and is only connected to one child-radio-subunit.

d) a leave-radio-subunit (RSU-L) provides an interface to the parent-radio-subunit but is not connected to any child-radio-subunit, so only one connector pin of the connector interface of such a radio-subunit is used.

It is desirable that all radio-subunits are made identical and their behavior (e.g., root, node, branch, leave) depends on how they are configured. Each radio-unit may contain at least one FPGA. The FPGA may contain at least one controller. For maintenance and cost reasons, it is desirable that the embedded software (firmware) running on the embedded controllers is stored only at one place in the system. Likewise, it is desirable that the FPGA boot image is stored only at one place in the system.

In one embodiment of the invention, all RSUs that support hierarchical boot listen to the parent interface after reset. The RSU connected to the parent interface boots the slave RSU that in turn boots their children.

In one embodiment the FPGA image is stored in the root RSU. After boot, the root-RSU provides its children with the FPGA image. Yet, in another embodiment, the root RSU receives the FPGA image through the ISU. In another embodiment the firmware for the radio-subunit controllers is stored in the root RSU. After boot, the root-RSU provides its children with the firmware image. Yet, in another embodiment, the root RSU receives the firmware image through the ISU.

In an embodiment of the invention the radio-subunit comprises a clock generator that is designed as a clock slave for the parent-radio-subunit and that is designed as a clock master for the child-radio-subunits. Every radio-subunit comprises a clock generator. In a signal processing system with extremely high parallelism it is necessary that all clocks and oscillators in particular the oscillators used to clock the converters in the transceivers, and the oscillators to drive the mixer in the transceivers are synchronized to one common clock reference not only within a single radio-subunit but also between the radio-subunits in a radio-unit. In order to ensure that the phases, amplitudes and time offsets of all signals are aligned to each other the radio-subunit acts as a clock slave to its parent-radio-subunit and as a clock master to its child-radio-subunits (children In a particular embodiment of the invention the connector interface of the radio-subunit comprises parent-connectors, child-connectors and route-through connectors. The connectors of the interface are named according to their usage. Preferably, the inventive radio-subunits have three parent connectors, three child-connectors and six route-through connectors. Assuming, the inventive radio-subunits have a quadrature shape, three connectors are positioned on every side. Starting clockwise in one corner of that quadrature shape the different connectors are preferably positioned in one embodiment like: parent-parent-route through—route through-child-route through—child-child-route through—route through-parent-route through connectors.

The benefit of this arrangement in this special order is that all possible configurations needed for an optimized scalable radio-unit and therefore antenna system can be realized. With that configuration the shortest possible signal paths from the root-radio-subunit to the last leave-radio-subunit in the highest hierarchical level can be realized or adapted by rotating the modular radio-subunits to each other. Thus, a highly flexible structuring of modular antenna system arrays is possible.

In one embodiment of the invention, the antenna-module comprises at least one antenna, whereas the antenna comprising at least one antenna elements.

In a preferred embodiment the antenna elements of the antenna are cross-polarized. And in another preferred embodiment the antenna elements have a Vivaldi-structure.

A Vivaldi structure looks like petal-like rays. Two of these petal-like rays form one antenna. On one antenna module up to eight antenna elements are positioned. This antenna structure is preferably used for indoor applications, because (a) polarization does not provide much of diversity and therefore can be omitted, and (b) Vivaldi antennas are very cost effective. Furthermore, the production of such structures is very easy by printing on flexible and thin substrates, and therefore it is cost-efficient.

The object of the invention will be solved also by a method in such a way that beamforming, calibration, clock and timer procedures are performed within a radio-subunit. The decentralizing of the signal processing from a central hub to the radio-subunits enables the antenna systems to be scalable. Because the wiring becomes easier, the number of antennas and therefore the number of antenna elements can be increased. For example, a fraction of the required signal processing, like the beamforming, is performed by the digital signal-processing unit, typically a FPGA, in the radio-subunits. To be specific, a radio-subunit performs in receive direction a partial Rx beamforming by calculating partial weighted sums over all received signals in the radio-subunit weighted by the corresponding beamforming vectors. The radio-subunit performs the Rx beamforming algorithms for the antennas and antenna elements that are connected to said radio-subunit. The beamforming is performed for each IQ stream (layer) for that radio-subunit, respectively.

The radio-subunit also performs in transmit direction partial Tx beamforming. The radio-subunit performs the Tx beamforming algorithms for the antenna and antenna elements that are connected to said radio-subunit. The beamforming is performed for each IQ stream (layer) for that radio-subunit, respectively.

The radio-subunit also performs the calibration of the amplitude, the phases, and sample latencies of all signals at the antenna elements of that radio-subunit.

The radio-subunit aligns its common phase offset, common amplitude offset, and common time offset to a root-radio-subunit.

The radio-subunit provides a clock reference to all child-radio-subunit connected to said radio-subunit in order to align their phases, amplitudes and time offsets with the clock reference provided by said radio-subunit. In this case the radio-subunit is called a parent-radio-subunit. This parent-radio-subunit acts as a clock master to other radio-subunits that are connected to said radio-subunit as child-radio-subunits and the child-radio-subunits act as a clock slave to the parent-radio-subunit.

In the signal-processing unit of a radio-subunit all partially summed up received signals from child-radio-subunits are aggregated by adding them together for each respective layer and by adding the calculated partial sum for each layer. The term "layer" has been adopted specifically to refer to signals and their processing in Long Term Evolution (LTE) systems. It is synonymous with a stream. For MIMO, at least two layers must be used. Up to four are allowed in the 3GPP LTE Release 9 standard. The number of layers is always less than or equal to the number of antennas.

Furthermore, all Tx data signals are replicated and forwarded to the connected child-radio-subunits.

The radio-subunit may contain a local timer that is synchronized to the timer of the root-radio-subunit of the radio-unit.

There are three possible topology architectures: I. daisy chain, II. star and III. tree.

Figure 6A:
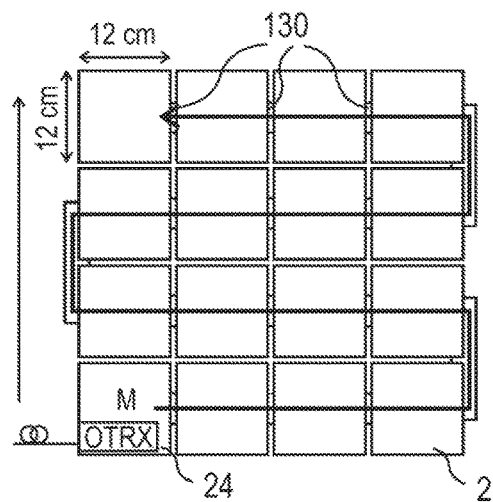

I. In the daisy chain topology all radio-subunits 2 are positioned in one logical row. This is shown in FIG. 6a. The topology needs the lowest number of connection 130 per radio-subunit 2. On the downside, the length of the chain is the largest and, thus, one big clock driver is needed. There is also an increased risk to keep a reasonable signal integrity and in case of multiple PLLs (Phase looked loops) the risk of phase scintillations increases. Also the calibration procedure between the multiple radio-subunits is not easy, because of the long calibration path, the risk of losing accuracy and also the risk to keep reasonable signal integrity during calibration. This topology shows the highest latency between signals.

Figure 6B:
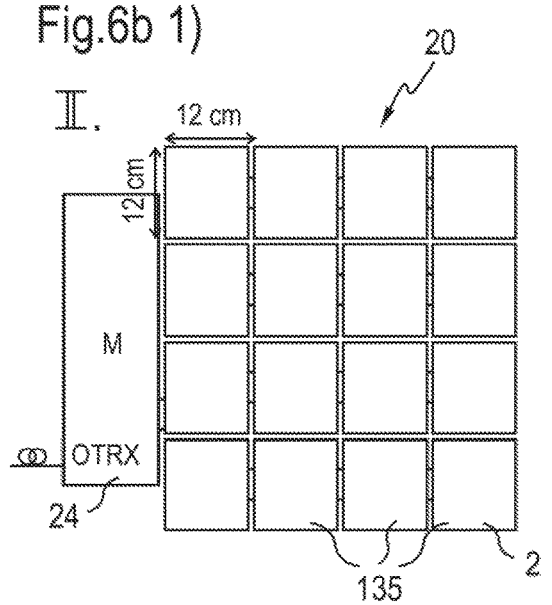
Figure 6B:
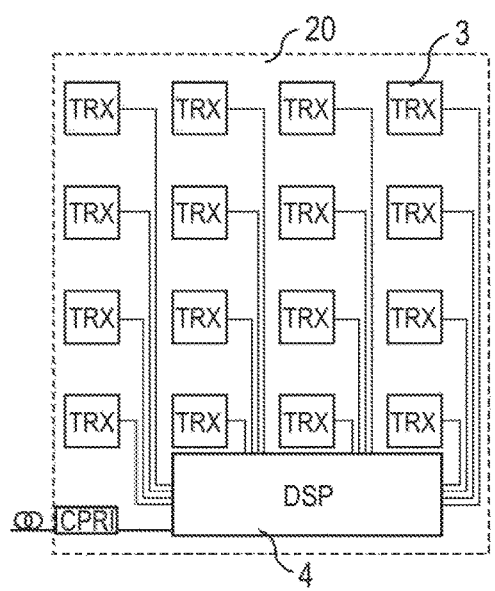

II. In the star topology one root-radio-subunit 24 is driving multiple rows of multiple radio-subunits 2. The signals need to be brought from the root-radio-subunit 24 to every branch in the radio-unit 20, respectively. And there are two types of radio-subunits needed: A root-radio-subunit 24 that can support multiple branches and child- or slave-radio-subunits 135. This is shown in FIG. 6b part 1) for a setup with four rows. There is only one clock source or clock generator on the root-radio-subunit 24 connecting all rows of radio-subunits 2. Part 2) of FIG. 6b shows many high speed connections to central signal processing unit 4, e.g. 128 connections for 128 transceivers 3, therefore one large expensive FPGA is required in the star topology which is also a power dissipation hot spot. But there are fewer hops per row compared to the daisy chain topology needed, so the risk of compromising signal integrity is lower. Because of the lower depths per row of radio-subunits compared to the daisy chain topology, the calibration path is lower. But the risk to loose accuracy due to long wires is not better than in the daisy chain topology.

Therefore, these two topologies are no longer considered.

III. In the tree topology, three radio-subunit configurations or types are used. The three types differ only in their function, not in their architecture, which is identical for all. There are node-radio-subunits that can support multiple branches in the radio-unit and that are connected to exactly one parent-radio-subunit and can be connected up to three child-radio-subunits. Furthermore, there are branch-radio-subunits each providing an interface to one parent-radio-subunit and that is only connected to one child-radio-subunit. And the third type is the leave-radio-subunit that provides an interface to one parent-radio-subunit but is not connected to any child-radio-subunit. The tree topology has the highest flexibility for extensions and therefor the best scalability. But there is only one clock source or clock generator on the root-radio-subunit connecting to all rows, but there are fewer hops per row compared to the daisy chain topology. For the tree topology a hierarchical calibration procedure is used that assumes the best accuracy and signal integrity. The tree topology is an optimum compromise between flexibility and scalability with lowest risk with respect to clock distribution and calibration. The same design can be used for products with little specific customization required.

The present inventive architecture uses the tree topology. According to the topology mentioned above, the architecture follows a logical tree, where each radio-subunit is connected to exactly one parent-radio-subunit and may be have one or multiple child-radio-subunits connected to. The root-radio-subunit acts as a parent-radio-subunit, but it can also be connected to an interface-subunit that behaves like a parent-radio-subunit to the root-radio-subunit and is an interface to the base station.

For connecting one radio-subunit with another, IQ signals can be serialized and multiplexed. For this purpose, CPRI or a CPRI-like interface may be used. Redundancy may be added by providing an alternate route inside the radio-unit in case one route fails. This is possible, because all radio-subunit have the same connector interface and can fulfill all configurations presented.

The high-speed serialized interfaces of the radio-subunits may be used to provide a clock reference from the parent-radio-subunit to the connected child-radio-subunits. Alternatively, a dedicated clock line may provide a clock reference from the parent-radio-subunit to the child-radio-subunits.

Aligning frames of child- to parent connection of one radio-subunit with the child—to parent connection of said radio-subunit of its subsequent radio-subunits may reduce latencies.

In a preferred embodiment of the invention an inter-calibration procedure is performed between mutually connected radio-subunits to synchronize all locally generated reference signals with a reference signal received by a parent-radio-subunit. Calibrating the amplitude, phases and sample latencies is necessary for an accurate signal processing of transmitted and received signals.

In another embodiment of the invention an intra-calibration procedure is performed within a radio-subunit to synchronize all transceivers connected to antenna elements of the radio-subunit with the locally generated reference signal.

For general calibration purposes each radio-subunit contains a correlator that can correlate a signal received by one of the local receivers or from the reference receiver. The reference receiver can receive the signals from a parent-radio-subunit and/or a signal coupled out of one of the local transmit paths and/or the reference transmitter. A local transmit path is the path on which a signal is passed from the signal processing unit of a radio-subunit to the specific antenna element of that radio-subunit. Thereby, the reference transmitter can transmit a generated reference signal to the following outputs, namely to the reference receiver, or to any of the local receivers on the radio-module by coupling in said reference signal into one of the local receive paths, or to any of the child-connectors of the radio-subunit. As defined above the radio-module is part of the radio-subunit where mainly the signal processing and the components thereof are arranged. Furthermore, each radio-subunit contains a reference signal generator that can generate a reference signal with good auto correlation properties, for example it may generate a modulated pseudo-random binary sequence. The reference transmitter and the reference receiver forward a synchronization signal or the generated reference signal in order to synchronize for example every beam forming vector according to the subframe structure of the transmit and receive signals that are received or transmitted by the antenna elements.

In case of frequency division duplexing (FDD) and if the transceivers do not contain separate couplers for transmit and receive directions, a duplexer consisting of a diplexer and band pass filters that allows for using the same coupler to couple a reference signal into the receive paths as well as receiving a signal coupled out of the receive paths.

Each radio-subunit contains switches that allow for switching the desired signal paths as well as storage means like EEPROM for storing factory calibration data for subsequent inter- or intra-calibrations.

For frequency division duplexing, where different frequencies are used for downlink and uplink transmission, the calibration alternates between receiver and transmitter calibration. Each calibration phase is subdivided into three sub phases: Firstly, an inter-module calibration is performed, where it is ensured that all locally generated reference signals are synchronized with the reference signal received by the respective parent-radio-subunit. Secondly, an intra-calibration is performed, where all receivers or transmitters depending on the phase are calibrated to match the locally generated reference. Thirdly, the measured phase offsets are propagated to the root-radio-subunit, the radio-subunit that is on top of the hierarchy.

In the following, the inter- and intra-calibration will be shown, exemplary, for a hierarchical 4×4 radio-unit of an antenna system, meaning a radio-unit with 16 radio-subunits:

The calibration is performed in a hierarchical fashion. Firstly, the inter-calibration among the radio-subunits is performed. Thereto the root-radio-subunit in the first hierarchical level provides a reference signal to the radio-subunits followed in the second level of the architecture. Then the radio-subunits of this second hierarchical level provide a reference to their child-radio-subunits in the third level which follows after the second level of the architecture. The radio-subunits of the second hierarchical level provides in turn a reference signal to their child-radio-subunits of the forth hierarchical level which follows after the third level of the system architecture. When the inter-calibration is finished, each radio-subunit calibrates the local transceivers of its own radio-module.

Especially in high frequency applications a very low phase noise is required. Therefore, a consistent clock distribution is absolutely necessary. The distribution is done over the CPRI and no further clock line will be needed. For example, as mentioned above, every radio-subunit has its own clock generation combined with synchronization with the parent-radio-subunit, for example at a frequency of 38.4 MHz. For synchronization a 8/10 regime is used, meaning every 8 bits 2 bits for synchronization purposes are used. Alternatively, the 64/66 bit encoding scheme may be used that has substantially less overhead. I In a further embodiment of the invention considering the receive direction, the IQ-signals from all radio-subunits are weighted, aggregated and forwarded to the root-radio-subunit and further forwarded to the base station and considering the transmit direction, the IQ signals are replicated and forwarded to the radio-subunits.

The object of the invention is also achieved thereby that the modular antenna system concerns the different stages of a maintenance process.

In stage 1, characterizing the error detection the proper function of the active antenna system and therefore the proper function of every radio-unit and every radio-subunit is constantly monitored. Any malfunction is reported to the network control through the antenna's network interface. If this network interface is subject to an error, the antenna is accessible through redundant wired and wireless data interfaces, e.g. WiFi, Bluetooth, RJ45. Using a wireless connection, the active antenna can be configured from the ground and without having the need to access the core network. If repair requires physical access to the hardware, the technician can open the front part of the casing. The malfunctioning radio-unit or radio-subunit of a radio-unit is indicated visually, e.g. through flashing LEDs. One main advantage of the modular approach is that a defect can be localized and isolated.

For stage 2, the invention does not consider any ad-hoc measures.

In stage 3, characterizing repair or replace device, once a defect of the entire active antenna system is narrowed down to an error of a particular radio-subunit, the radio-subunit should be replaced. In the prior art, the radio-subunits are connected directly through cables for digital or analog signals and power. In contrast to that, now the individual radio-subunits are held in position by a frame that provides a backplane for the exchange of signals. Different active antenna configurations can be achieved through customized frames. It is particularly advantageous that connectors are provided on every radio-subunit, e.g. only male connectors and a connector bridge can be realized, e.g. by female connectors with a small printed circuit board on the frame side or backplane side. Having this frame in place, individual radio-subunits can be replaced on site. The main advantage of this invention is that a technician can easily replace a defect radio-subunit without having to touch any of the other radio-subunits.

The ease of antenna maintenance is facilitated by this invention through a modular design, where each radio-subunit can be plugged onto a frame or backplane board. The radio-subunit has the antenna element on the antenna module to the front and the electronics facing the back on the radio-module. In case of a sandwich architecture where multiple boards are involved, the top board shall include the antennas and the connectors shall face the back. The defect board can be easily pulled out from the front. This modular approach and architecture reduce the time and effort to monitor and repair an active antenna system.

The invention will be illustrated by means of embodiments. The corresponding drawings show

BRIEF DESCRIPTION OF THE DRAWING FIGURES

Figure 7:
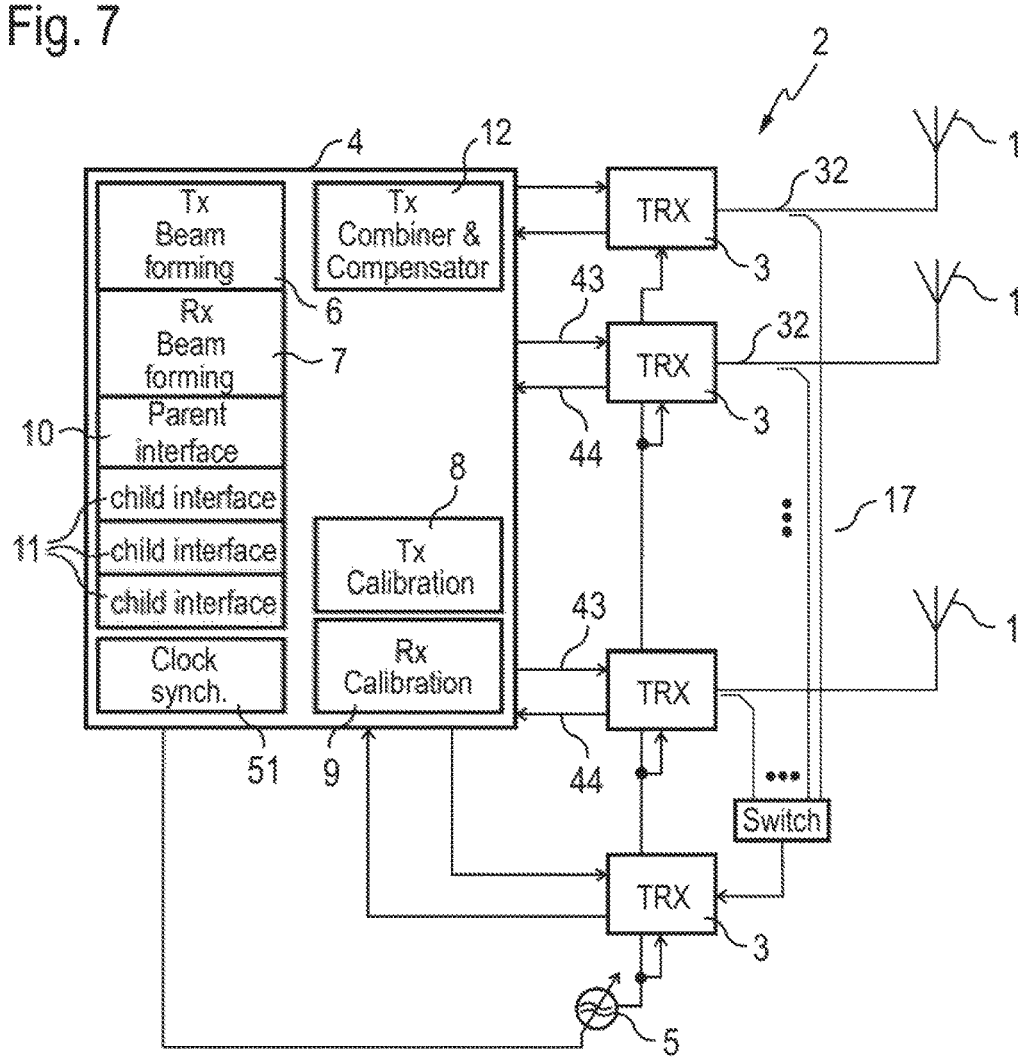
Figure 8:
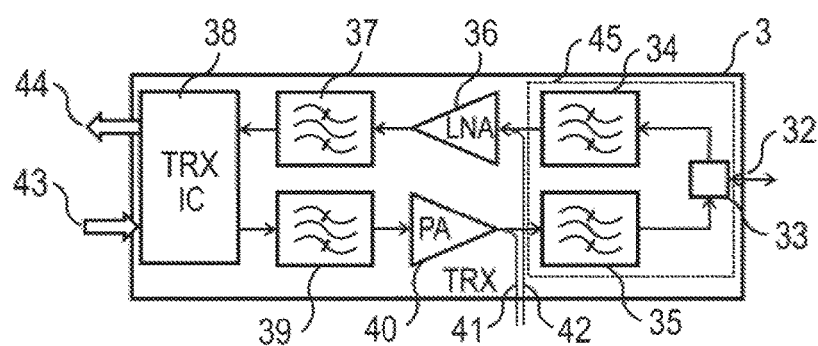
Figure 9:
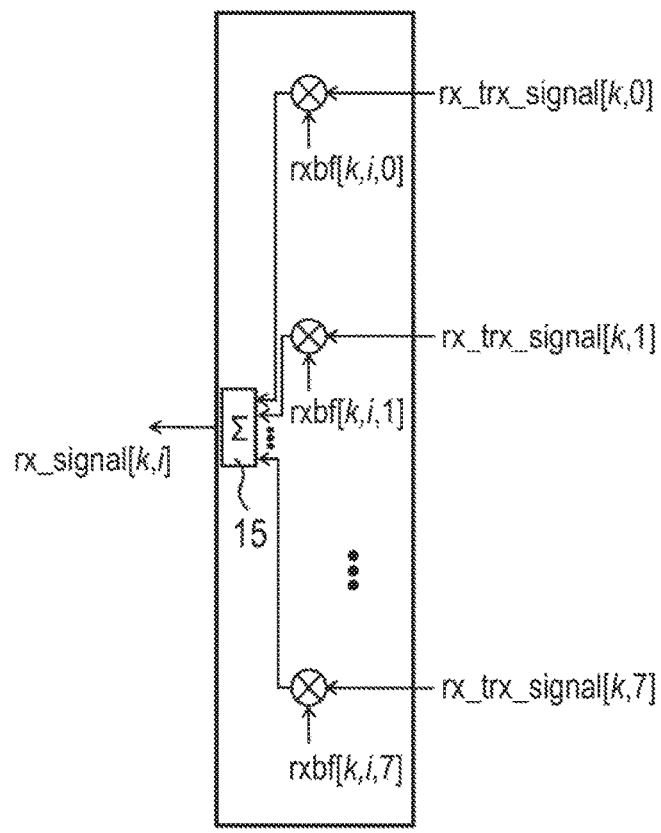
Figure 10:
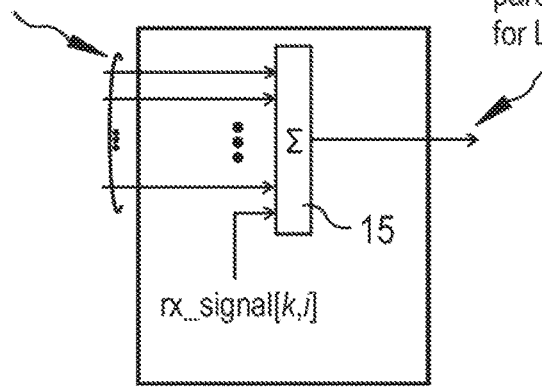
Figure 11A:
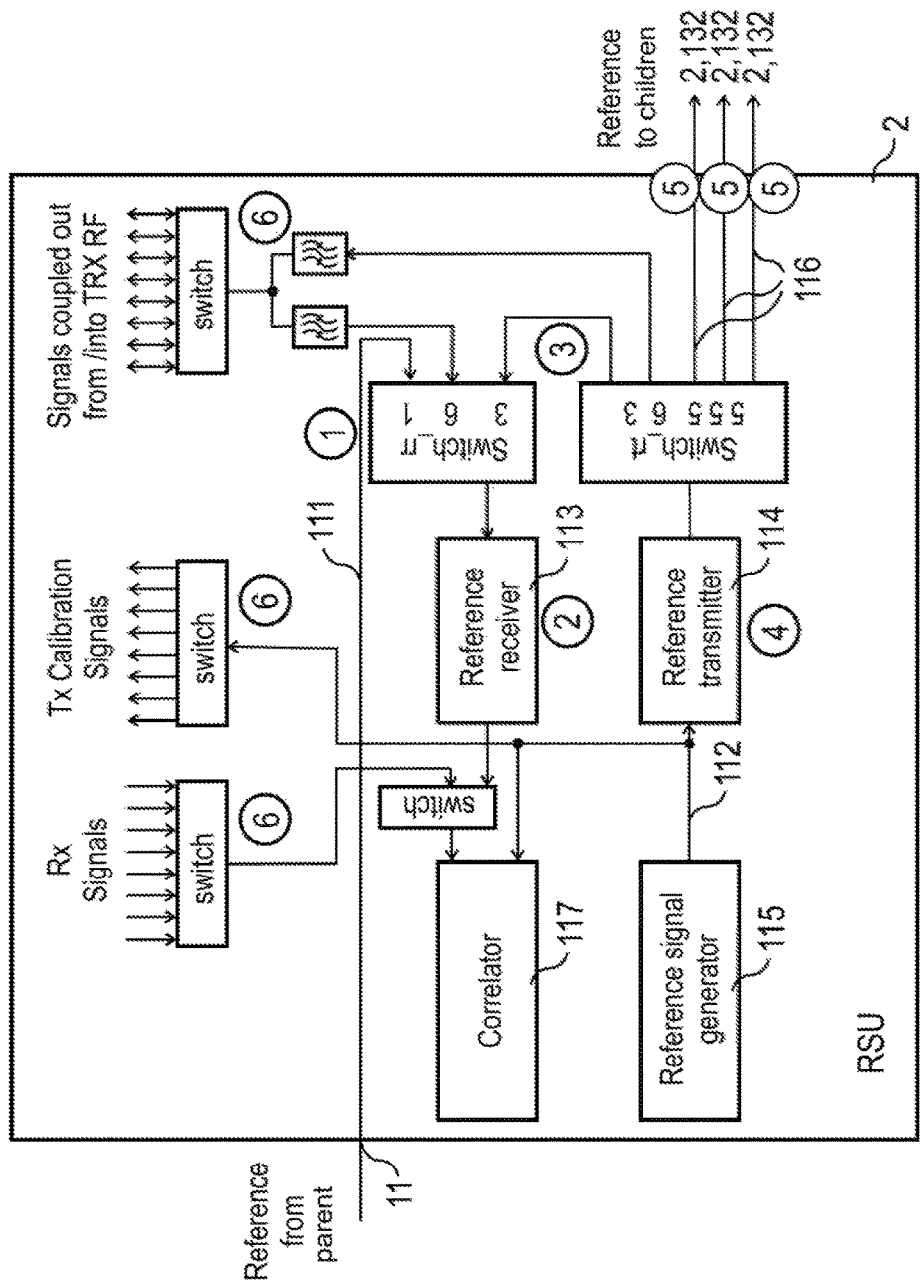
Figure 11B:
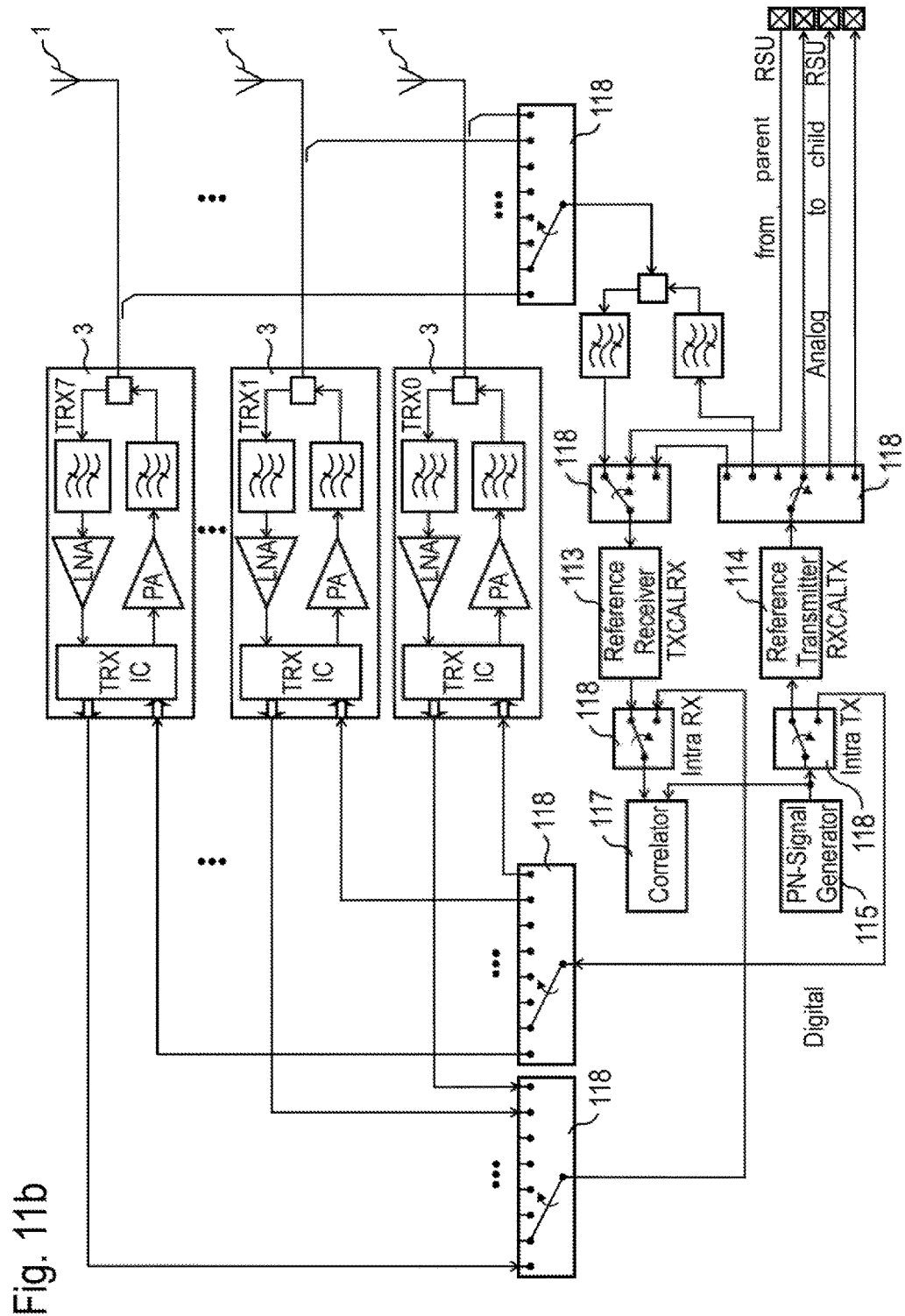
Figure 12:
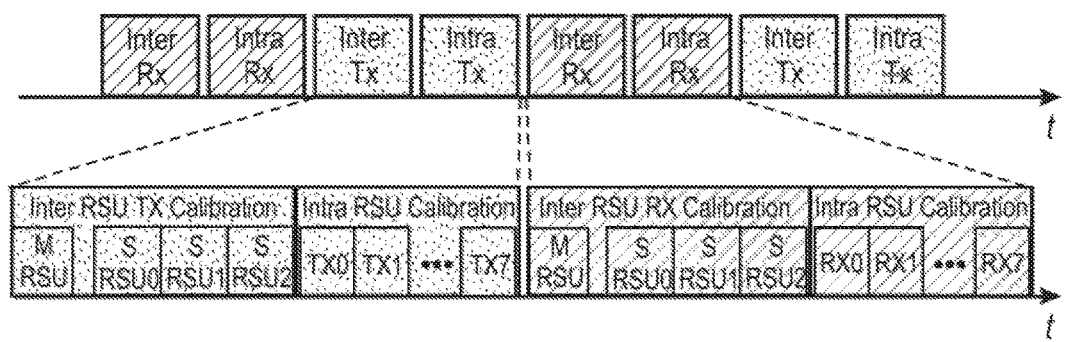
Figure 13:
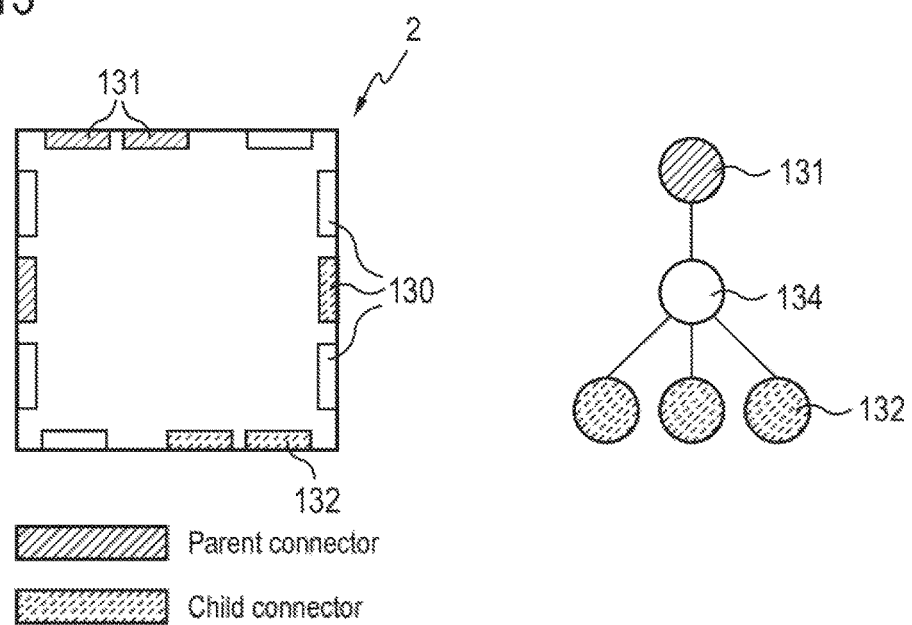
Figure 15:
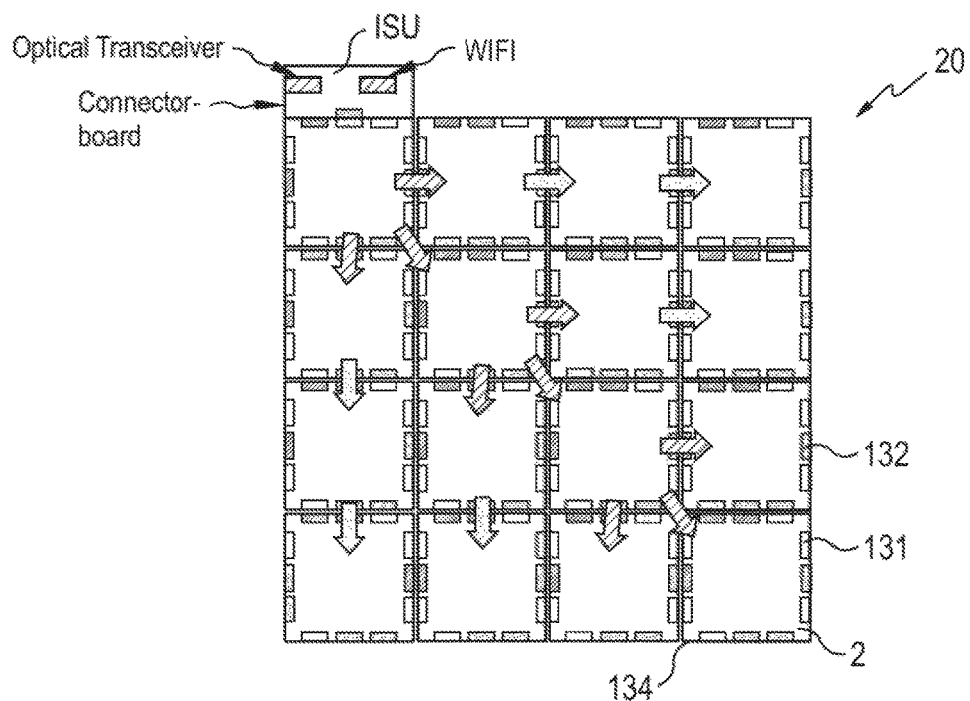
Figure 16:
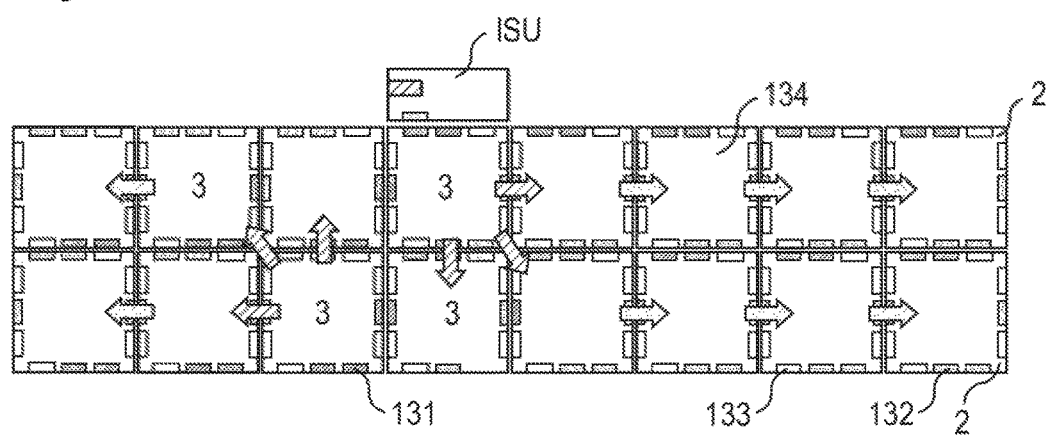
Figure 17:
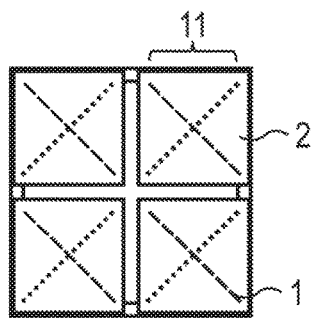
Figure 18:
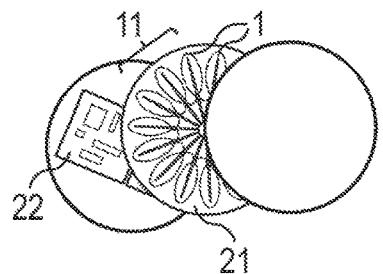
Figure 20:
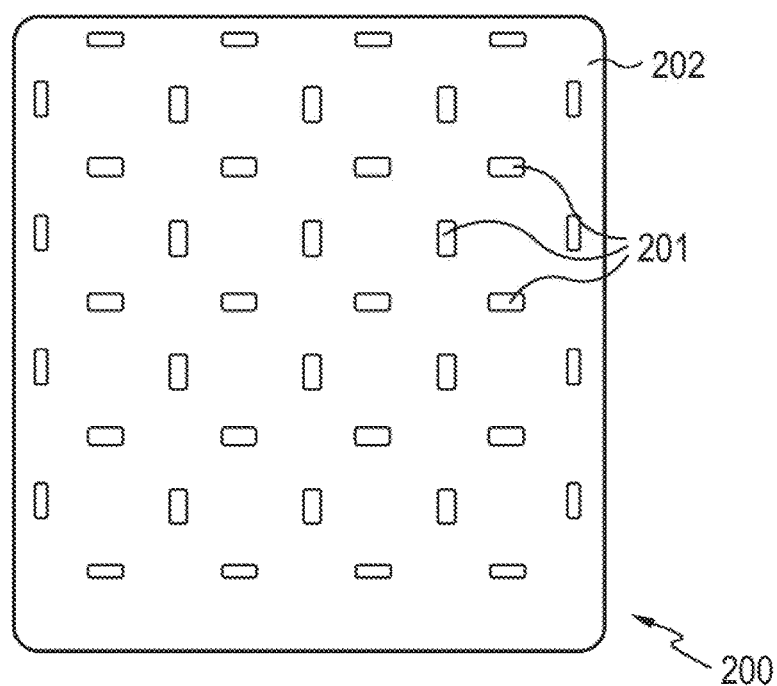
Figure 21:
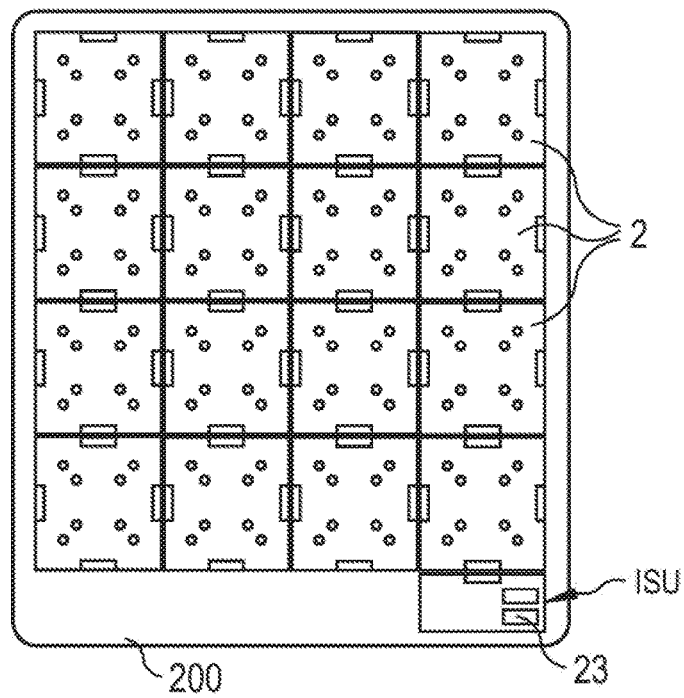
Figure 22:
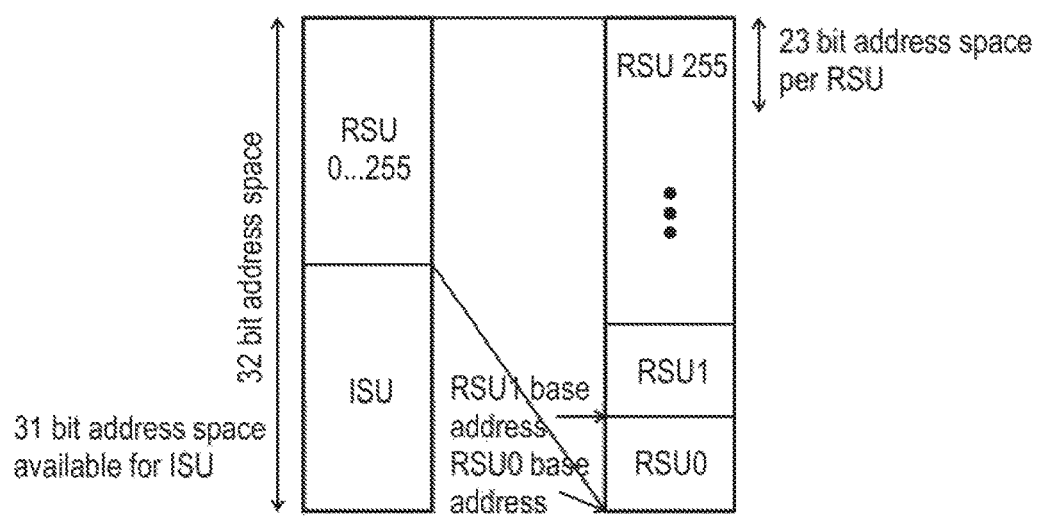
Figure 23:
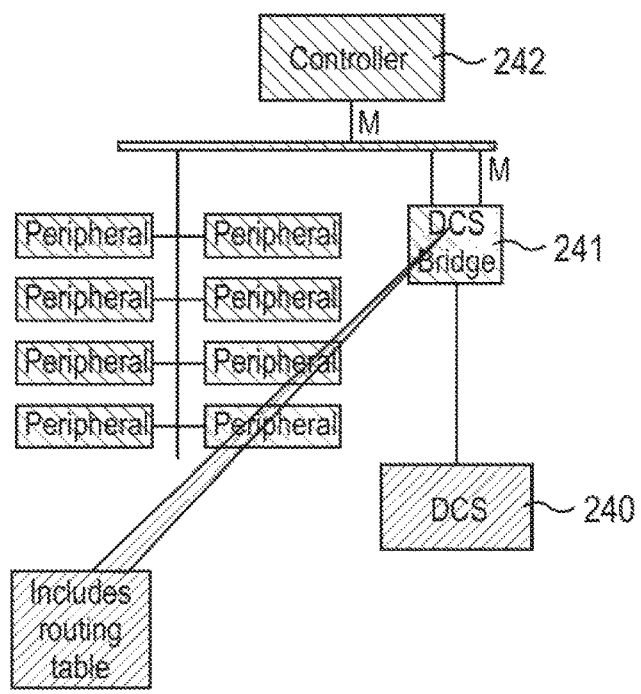
Figure 24:
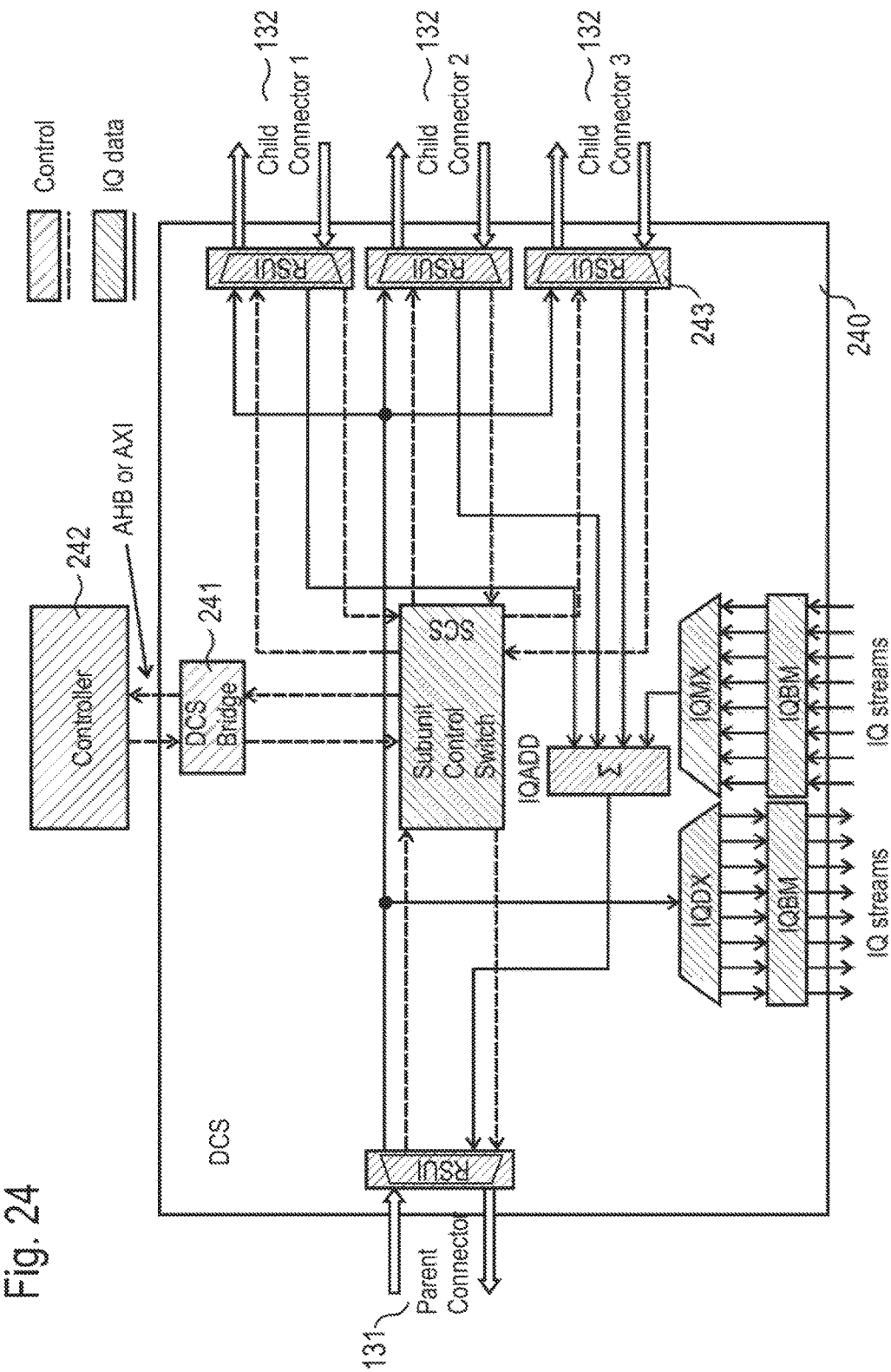
Figure 25:
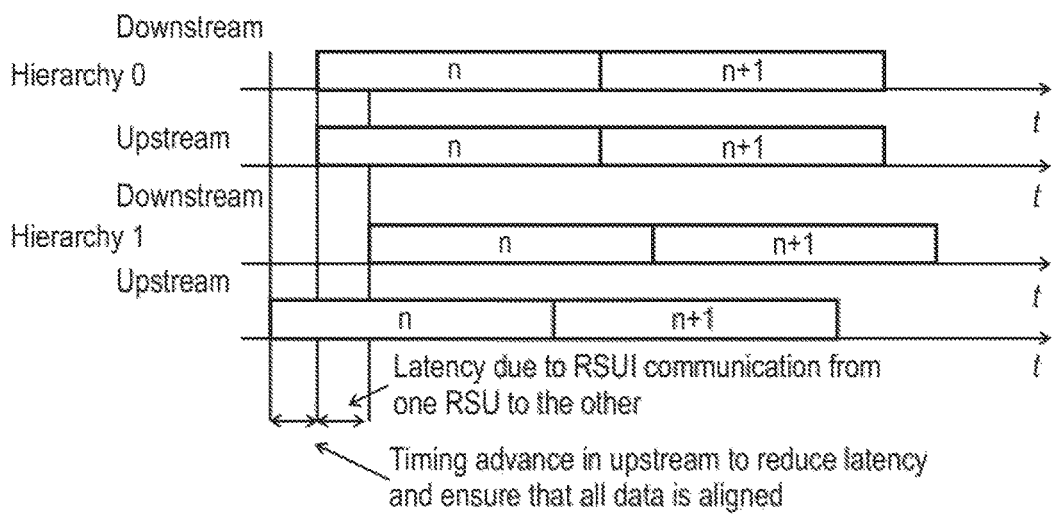
Figure 26:
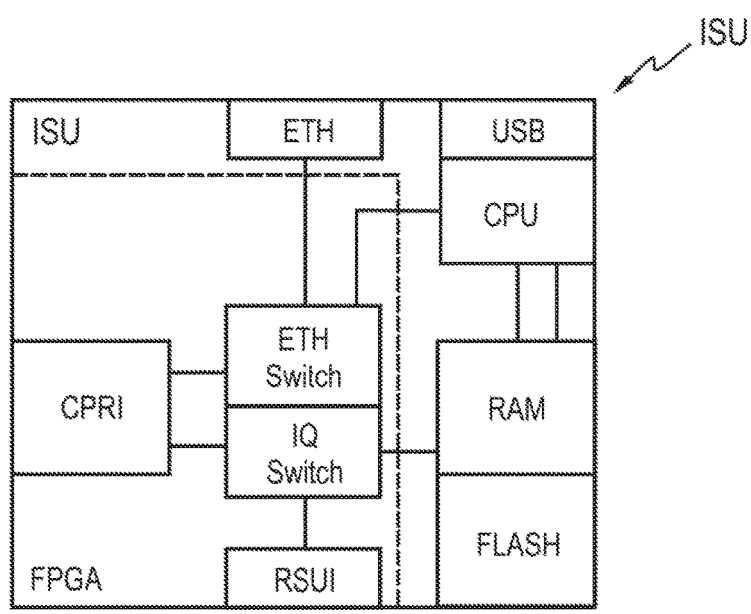
Figure 28:
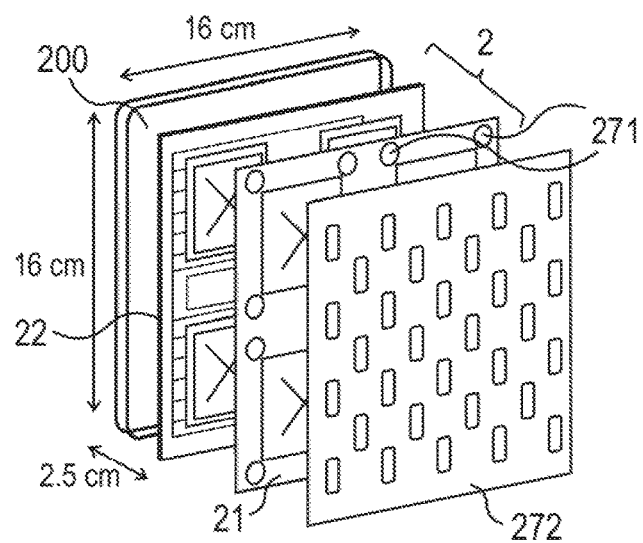
Figure 29:
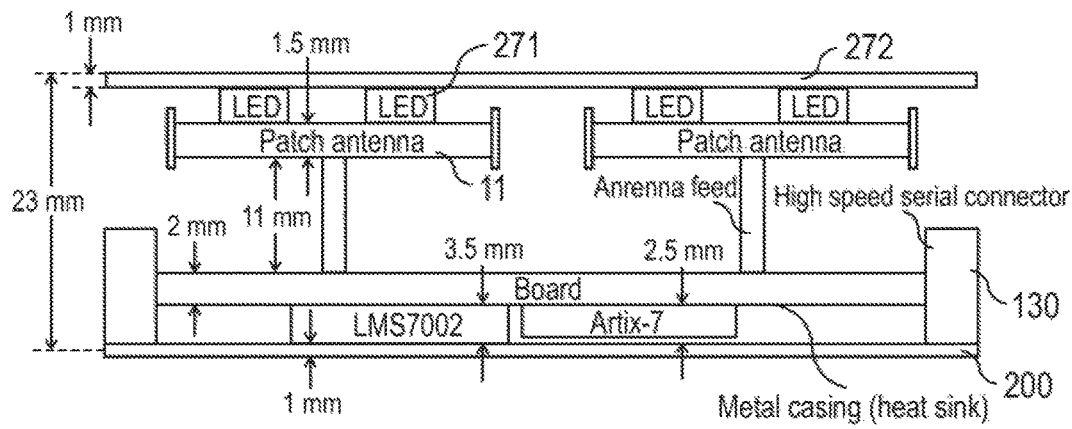
Figure 30:
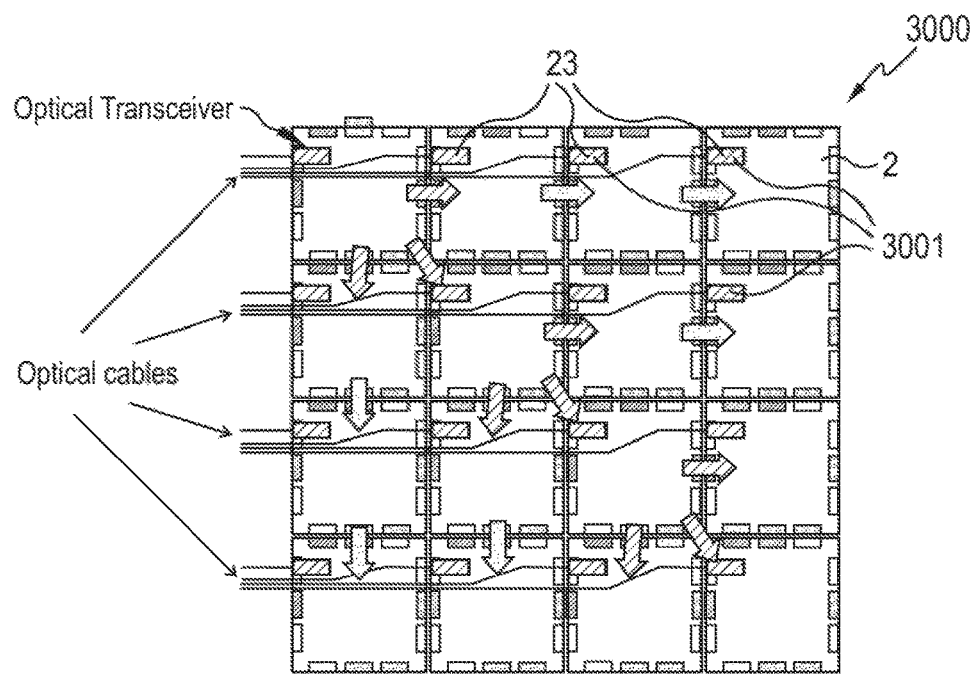

FIG. 1 A schematical drawing of a conventional architecture for active antennas;

FIG. 2 Rx beamforming in a large scale antenna system (LSAS) using the conventional architecture;

FIG. 3 Tx beamforming in a large scale antenna system (LSAS) using the conventional architecture;

FIG. 4a Illustrating the terms used for describing the present invention;

FIG. 4b-c Illustrating the modular architecture of the present invention b) Radio-unit with radio-subunits; c) four radio-subunits showing the signaling processing on the radio-module FIG. 5 Schematical overview of the Tx beamforming;

FIG. 6a Daisy chain topology: All radio-subunits are positioned in one logical row;

FIG. 6b Star topology: 1) One root-radio-subunit is driving four rows of multiple radio-subunits; 2) signal processing on the radio-module;

FIG. 7 A Conceptual diagram of a radio-subunit;

FIG. 8 A detailed block diagram of a transceiver;

FIG. 9 Rx beamforming logic of the k-th radio-subunit and the i-th Rx IQ signal layer;

FIG. 10 Partial sum aggregation and combining of radio-subunit k;

FIG. 11a A conceptual block diagram of calibration circuit and logic;

FIG. 11b A conceptual block diagram of calibration circuit and logic divided into the digital and analogue part with switches that change their status every clock cycle shown in FIG. 12;

FIG. 12 A calibration cycle;

FIG. 13 A radio-subunit and its specific connector arrangements;

FIG. 14 Example of data flow through the combined radio-unit;

FIG. 15 A modular antenna array system made of 16 radio-subunits and an interface-subunit;

FIG. 16 A radio-unit arrangement for a 2×8 radio-subunits array;

FIG. 17 A radio-subunit with four cross polarized antennas, whereas the antennas consist of two polarized antenna elements;

FIG. 18 A radio-unit comprising antenna elements with a Vivaldi structure;

FIG. 19 a) A conceptual block diagram of a clock distribution inside a radio-unit comprising two radio-subunits and b) daisy chaining of the clock between three radio-subunits;

FIG. 20 Backplane for mounting the radio-subunits onto it;

FIG. 21 Mounted radio-subunits and interface-subunit on a backplane;

FIG. 22 A global memory map for addressing a radio-unit with its radio-subunits;

FIG. 23 A data and control switch extended by a bus on control side;

FIG. 24 Conceptual routing inside the data and control switch;

FIG. 25 Diagram visualizing the upstream timing advance to reduce latencies;

FIG. 26 A schematical drawing of an interface-subunit;

FIG. 27 a) an illuminated sign of an advertising system consisting tiles with LEDs as known from the prior art; b) combination of an illuminate sign of an advertising system consisting tiles with LEDs and radio-subunits of an antenna system;

FIG. 28 A radio-subunit tile of a divided system comprising the radio-module, the antenna-module with LEDs and a light distributor;

FIG. 29 A cross-sectional view of the divided system comprising the radio-module, the antenna-module with LEDs and a light distributor;

FIG. 30 A schematical view of a general LSAS radio-unit.

EMBODIMENTS

FIG. 7 shows the conceptual diagram of a radio-subunit 2. As can be seen from the drawing, the radio-subunit 2 contains multiple antenna elements 1, transceivers 3 and a signal processing unit 4. It also contains some couplers 17 that are able to couple out a fraction of the Tx signal (transmitted signal) and likewise are able to couple in a calibration signal into the receiver. In the embodiment depicted in FIG. 8, the signal is coupled out 32 after the transceivers 3. In another embodiment of the invention, it is also possible to couple out the reference signal 41, 42 inside the transceiver 3, in Tx direction before the duplexer filter 35 and in Rx direction after the duplex filter 34.

All transceivers 3 interface to the radio-subunit's signal processing unit 4 (see FIG. 7). The signal processing unit 4 performs the partial Tx beam forming 6, the partial Rx beam forming 7, whereas the partial Tx calibration 8 and the Rx calibration 9 also referred to as intra-calibration that means the calibration of the signal processing components, e.g. the transceivers 3, to each other. The common Tx and Rx calibration also referred to as inter-calibration that means the calibration between the different radio-subunits 2 of a radio-unit 20. Additionally, it contains the interface to its parentradio-subunit and it contains multiple child-connector interfaces 11 (in the drawing of FIG. 13 exactly three) to which multiple child-radio-subunits can connect. Furthermore, the radio-subunit 2 contains a means to generate its own clock 5 and a means 51 to synchronize said clock to the clock of the parent-radio-subunit.

FIG. 8 shows a detailed block diagram of a transceiver 3 where the Tx calibration signal 41 is coupled out before the duplexer 45. Likewise, in this embodiment, the Rx calibration signal 42 is coupled in after the duplexer 45 and before the low noise amplifier 36. The duplexer itself consists of the Tx duplex filter 35, the Rx duplex filter 34 and the diplexer 33. The transceiver in FIG. 8 takes digital Tx signals 43 from baseband or low intermediate frequency and up-converts them to RF transmit frequency. The Tx signal is then filtered by the Tx filter 39 and then presented to the power amplifier 40. In receive direction the received signal coming out of the duplexer 45 is first amplified using a low noise amplifier 36. The amplified received signal is then passed through an Rx band filter 37 and then down-converted to baseband or low IF by the transceiver IC 38. The transceiver IC 38 also performs analog-to-digital conversion and presents the digital Rx signals at its output 44 to the signal processing unit 4.

In case of a low IF interface to the transceiver 3, the signal processing unit 4 performs digital up-conversion from baseband to low IF in transmit direction. Likewise, in receive direction, the signal processing unit performs digital down-conversion from low IF to baseband.

The signal processing unit 4 itself performs partial Rx beamforming 7, i.e., each Rx signal in the radio-subunit 2 is weighted in both phase and amplitude and then added 15 to form a partial weighted sum of the received signals as shown in FIG. 9.

According to the invention, the partial sum for a particular layer i is combined with other partial sums received from child-radio-subunits connected to radio-subunit k to be forwarded to the parent-radio-subunit connected to radio-subunit k. This is illustrated in FIG. 10.

Intra-Calibration

As mentioned above, calibration is very important for spatial alignment of transmit signals and, therefore, controlling the antenna pattern. For a modular antenna array system to work properly, it is of utmost importance that each antenna element 1 transmits and receives signals with a known phase, amplitude, and latency with respect to the other antenna elements 1 in the antenna array. Since transceivers 3 are not made to provide a fixed relative carrier phase and sample phase between one another, a calibration scheme is needed that also works in a hierarchical modular architecture.

The calibration procedure is based on injecting a reference signal 112 into the reference receive path and coupling a reference signal out of the reference transmit path (see FIG. 11a).

The digital reference signal 112 is also used to convert it to an analogue reference signal using the reference transmitter 114 to be forwarded to one of its child-connector interfaces 132.

The calibration procedure has a means to compare the locally generated reference signal 112 with a reference signal 111 received through one of its child-connectors thereby having the ability to compare the amplitude, latencies and phases between the locally generated reference signal 112 with the received reference signal 111.

The radio-subunit 2 also has the ability to adjust its locally generated reference 112 to exactly match the received reference 111 by having the means to adjust the latencies, phases, and amplitudes of the local reference transmitter 114 and of the local reference receiver 113, respectively.

Additionally, each radio-subunit 2 contains storage means, like EEPROM for storing factory calibration data. The factory calibration data contains offsets for latencies, phases, and amplitudes for both reference transmitter 114 and reference receiver 113 to accommodate any impairment that occurs between the boards. Those offsets are taken into account when adjusting the local reference receiver 113 and reference transmitter 114, respectively.

The factory calibration data may be temperature dependent. In this case, a temperature sensor measures the temperature of the radio-subunit 2 in operation and applies the appropriate calibration data for the particular temperature measured.

The calibration data additionally contains calibration data for all latencies, phases, and amplitudes of the local signal transmitters and signal receivers. Those offsets are taken into account when adjusting the local receivers and reference transmitters, respectively, such that after adjustment, the adjusted output is the desired output for the particular antenna element 1.

The conceptual block diagram of one embodiment of the calibration circuit and logic for a radio-subunit 2 supporting hierarchical calibration is shown in FIG. 11.

In a FDD system, the reference signal generator 115 needs to tune from Tx frequency to Rx frequency. It is possible to share the reference transmitter 114 to provide reference for Rx and Tx, respectively. Since a change of frequency likely eliminates the phase reference, an alternation between Rx and Tx calibration is needed. Such an alternation between transmit and receive calibration phases is visualized in FIG. 12. In a time-division duplex (TDD) system, there is no need to distinguish between transmit calibration and receive calibration, since in TDD systems, the downlink and uplink use the same carrier frequency.

Inter Calibration

The inter-calibration follows the following steps:

1. The radio-subunit 2 determines phase offsets from received parent reference signal 111. The desired phase offset compensates the phase offset coming from cable length between radio-subunits 2 and phase shifts of switches, etc. The desired phase offset is determined during factory calibration.
2. Then the radio-subunit 2 corrects the phase of the reference receiver 113 to the (factory calibrated) target and
3. the radio-subunit 2 determines phase offset between local reference transmitter 114 and reference receiver 113.
4. It compensates the reference transmitter 114 phase such that the reference signal 112 has the desired phase offset to the parent.
5. The radio-subunit 2 provides the calibrated reference signal 116 to the child radio-subunits 2 to allow for calibration of the child radio-subunits.
6. Then, the calibrated reference receiver/transmitter is used to calibrate the local transmitters/receivers on a radio-subunit 2.

The above mentioned calibration procedure is shown in FIG. 11b. The different calibration steps symbolized by the switches that can change their status between calibration steps is shown in FIG. 12, respectively.

Each radio-subunit possesses a timer (TIM) that is clocked by an integer multiple of the sample rate. For sampling offset time calibration, the same mechanisms as for Tx phase is applied. The measured integer time offset is used to correct the timer, the fractional time offset is compensated for by the fractional time correction block in the RXDIC, TXCIC and CAL HW blocks.

FIG. 13 shows a sketch of a physical radio-subunit 2 based on a square shaped printed circuit board (PCB) 134. Shown are connector 130 locations. A parent-radio-subunit can connect to the hatched connectors 131. Up to three child-radio-subunits can connect to the dashed hatched connectors 132. The dotted connectors are simply route-through connectors 133. It is envisioned that boards, meaning the radio-module, where the signal processing means and so on are positioned, are connected with some simple connector boards that only realize the connection. A connector board where the connectors are placed left and right on the opposite long edges, respectively, realizes a diagonal connection.

Figure 14A:
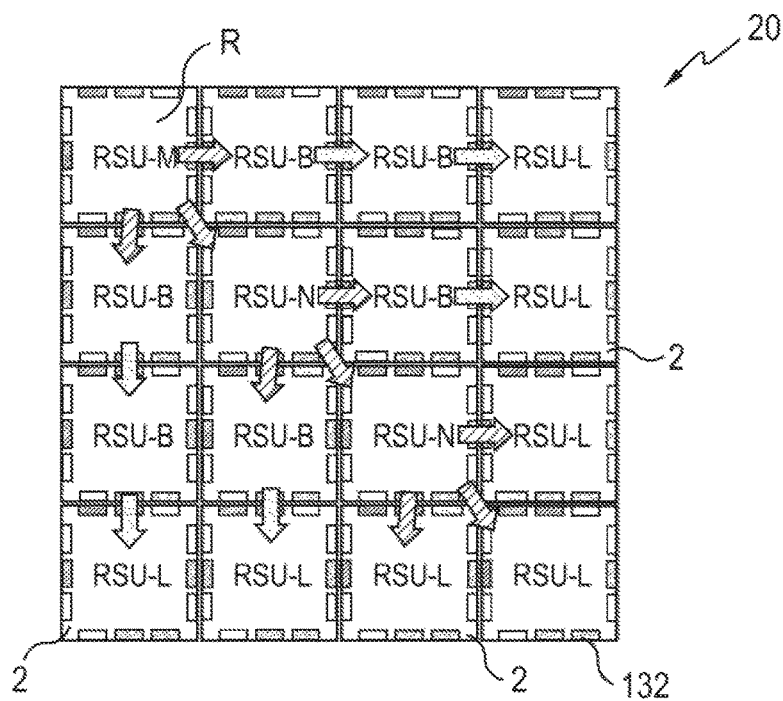
Figure 14B:
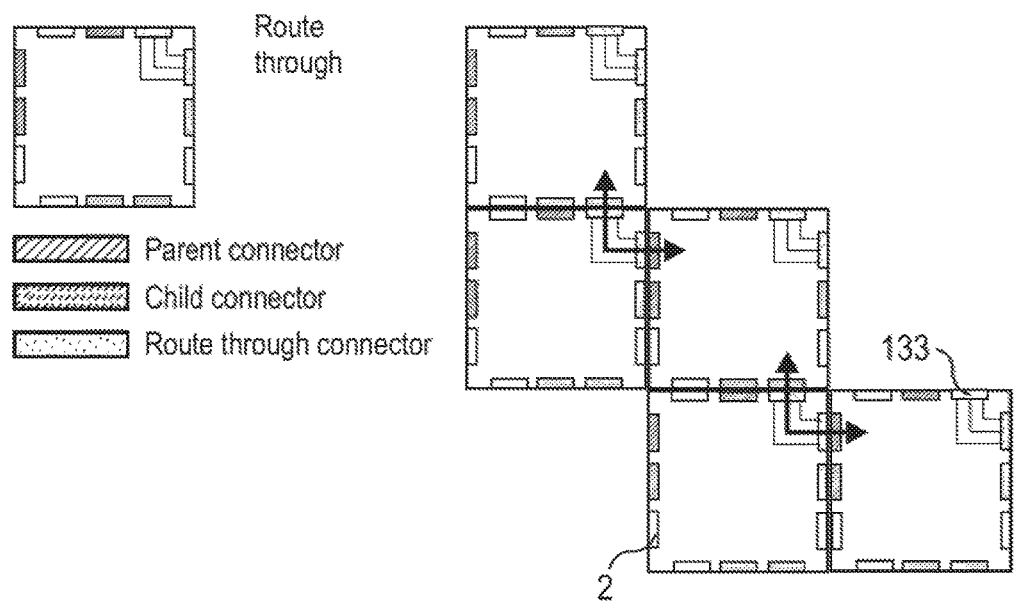

FIG. 14a shows a possible square shaped arrangement using sixteen square radio-subunits 2. FIG. 14a also shows the data flow in transmit direction. As it can be seen, the parent- to child connection 131, 132 starts from the upper left radio-subunit 2 (also named root-radio-subunit RSU-R) and follows the diagonal to the lower right of the arrangement. Each diagonal radio-subunit 2 (except for the lower right radio-subunit) connects three child-radio-subunits. All other radio-subunits 2 either terminate the transmit data or route it through in case another radio-subunit 2 is connected to them. FIG. 14b shows alternative routing avoiding diagonal connections whereas the route-through connections 130 are used.

One of the main advantages of this hierarchical arrangement is that it takes at most three hops from the root-radio-subunit RSU-R to any other radio-subunit 2 in the arrangement.

The root-radio-subunit RSU-R contains some additional functions. For example it, provides the interface to a baseband unit. In another embodiment, the interface functionality is implemented in a dedicated interface-subunit (ISU). Such a configuration is shown in FIG. 15.

Another arrangement for a 2 by 8 radio-subunit array is shown in FIG. 16. Here, the interface-subunit (ISU) connects to a radio-subunit 2 in the middle of the long edge. The maximum number of hops is limited to four.

In FIGS. 13 to 16, each radio-subunit 2 may contain four cross-polarized antennas 11 arranged in a square, whereas one antenna 11 consists of two polarized antenna elements 1, i.e., there are eight polarized antenna elements 1 in total. A schematic drawing of a radio-subunit 2 with four cross-polarized antennas 2 is shown in FIG. 17. In FIG. 14 one polarization is dashed and the other is dotted.

In another embodiment the antennas 11 can be formed in a Vivaldi-structure. This is shown in FIG. 18. A Vivaldi structure looks like petal-like rays. Two of these petal-like rays form one antenna 11. On one antenna module 21 up to eight antenna elements 1 are positioned.

Figure 19A:
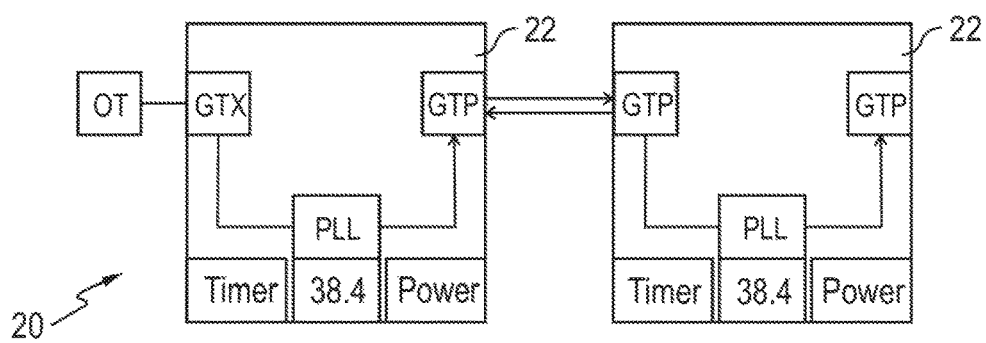
Figure 19B:
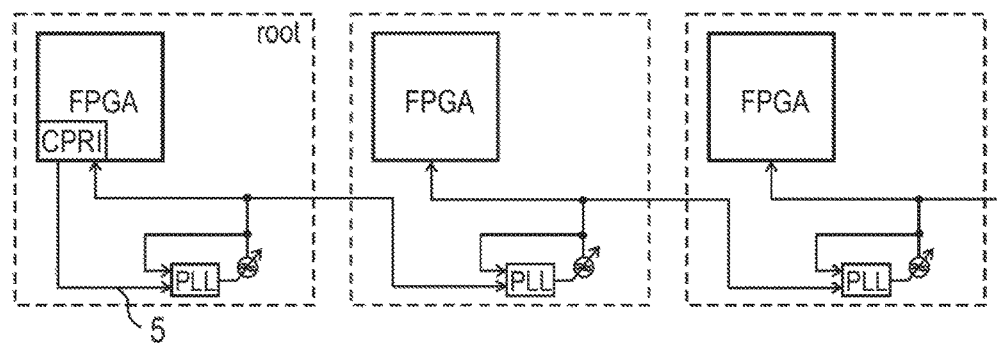

For a modular antenna array system to work properly, it is of utmost importance that each antenna element 1 transmits and receives signals with a known phase, amplitude, and latency with respect to the other antenna elements 1 in the antenna array. Therefore, a reference clock needs to be distributes to all transceivers. FIGS. 19a and 19b exemplarily illustrate the clock distribution inside a radio-unit 20. Especially in high frequency applications a very low phase noise is required. Therefore, a consistent clock distribution is absolutely necessary. The distribution is done over the CPRI and no further clock line will be needed. For example, this can be done at a frequency of 38.4 MHz which is generated by a clock generator at every radio-subunit 2. The daisy chaining of the clock in FIG. 19b avoids long clock wires. Over the CPRI connection the clock will be transferred from the base station and coupled into the root-radio-subunit and further to the following radio-subunits 2. For synchronization a 8/10 regime is used, meaning every 8 bits 2 bits for synchronization purposes are used. Alternatively, the 64/66 encoding is used where 2 bits for synchronization are inserted every 64 bits.

The following embodiment of the invention applies to the maintenance process. Its general objective is to reduce the time and effort to monitor and repair an active antenna array. FIG. 20 shows a backplane 200 in order to mount the radio-subunits 2 onto it. In an embodiment of it, the connectors can be mounted onto a metal ground plane. This advantageous embodiment allows an easy and flexible remote access to the antenna's monitoring, control and update functions. Therefore, the rate especially of those failures that bring about the need for physical access to the device is minimized. It is much easier to replace only the defect radio-subunits 2 instead of the whole radome. This maximizes the likelihood that such repair can be conducted on site, meaning without having to dissemble the device, if repair of components requires physical access to the system.

FIG. 21 shows the radio-subunits 2 mounted on a backplane 200 shown in FIG. 20. It includes also an interface-subunit ISU. This allows easy remote and on-site monitoring of the device through control information that is included in the network operation management process. For example, the access can be achieved through a local wireless interface such as WiFi or bluetooth. It also allows measures for self-healing either of the device itself or of the complete network in case of failure. This self-healing is supported through measurements in the deployment area which are exchanged with the antenna through some wireless interface. Measurements may also be collected and then exchanged through a wired interface after they are taken. The integral connections support remote boot of the antenna, initial functional test and reintegration of the antenna into the network as well.

Conventional analog antennas of cellular communication systems are typically attached to posts and can, therefore, be accessed from different angles. Active antennas achieve flexible adjustment of the horizontal and vertical radiation patter through analog or digital beamforming. They can, thus, be wall mounted.

An antenna 11 can consist of a radome that contains active and passive components. If any of these components is malfunctioning, it should be accessible without removing the antenna from the wall. Thus, the internal has to be accessible from the front. Clearly, this does not provide access to each and every hardware element. The innovation achieves the objective of easy on site repair anyways. The innovation applies to an antenna, which is built from multiple radio-units 20 and radio-subunits 2. The radio-subunits 2 could be either all the same hardware or different hardware. The radio-subunits 2 contain ways to indicate their proper function (or malfunction), such that a technician can easily identify which module has to be replaced. The radio-subunits 2 are connected through interfaces for digital and analog (RF) signals as well as for clock signals and power distribution. The innovation achieves that any radio-subunit 2 can be replaced without touching any other radio-subunit 2. The key idea is to place the radio-subunits 2 on a mixed signal backplane 200 that contains the connectors 201 required. The backplane 200 could, e.g., be a circuit board, which, in order to save weight and costs for material, could be a grid of several small circuit boards. Typically, the backplane 200 will not contain any active components to minimize the probability of a broken backplane. Some circuit board is required to route the signals between the different connectors 201. In one embodiment, the radio-subunits 2 are simply plugged into the backplane 200. In another embodiment, they are additionally mounted through screws, bolts, etc.

The modular approach is not only realized on hardware side but also in software regularities. FIG. 22 shows a global memory map in order to address every single radio-subunit 2 of a radio-unit 20. Therefore, the radio-subunits 2 have an identical memory map with different base addresses. Each micro-controller can address all registers and memories of all radio-subunits 2 in the radio-unit 20. This is important for inter-radio-subunit-communication, debug and boot procedures. In one embodiment up to 256 radio-subunits 2 can be supported. For an exact routing inside a radio-unit 20 and among all radio-subunits 2 every radio-subunit 2 comprises a data and control switch (DSC) 240 that controls and manages the routing of control and IQ data. This are shown in FIGS. 23 and 24. FIG. 23 disclose the data and control switch 240 extended by a bus on control side. A router forwards all information outside the radio-subunit address change to data and control switch bridge 241 that translates the information from a local bus to RSUI Protocol and vice versa and adds routing address according to an address translation table. FIG. 24 shows the routing inside the data and control switch 240 (DSC) distinguished in control data and IQ data. The radio-subunit-interfaces 243 (RSUI) compensates latency by advancing the upstream. The Upstream advance depends on the radio-subunit position in the hierarchy of the architecture. The Timing advance is a fixed value applied during RSUI initialization. Buffers are at RSUI to adjust IQ signal stream to the RSUI timing. This is exemplarily shown in FIG. 25 for the first and second level of the hierarchy. All communication is done through message queues, whereas all queues are unidirectional. A bidirectional queue is realized through two unidirectional queues. A queue is stored in memory of recipient (consumer) to avoid reads over the radio-subunit interfaces. The read and write pointers determine first-in-first-out level, whereas the read and write pointers are shadowed locally.

In one special embodiment the interface-subunit (ISU) contains all components of a modular antenna system that have to occur once in the whole system. The ISU is responsible for converting the data from CPRI to the radio-subunit-interface on the FPGA. It includes a CPU hosting which comprises a web interface, remote configuration, remote update and other services as well as options for a WLAN module, general purpose RAM for testing signal storage and data capturing. A schematical drawing of an interface-subunit is shown in FIG. 26.

Figure 27A:
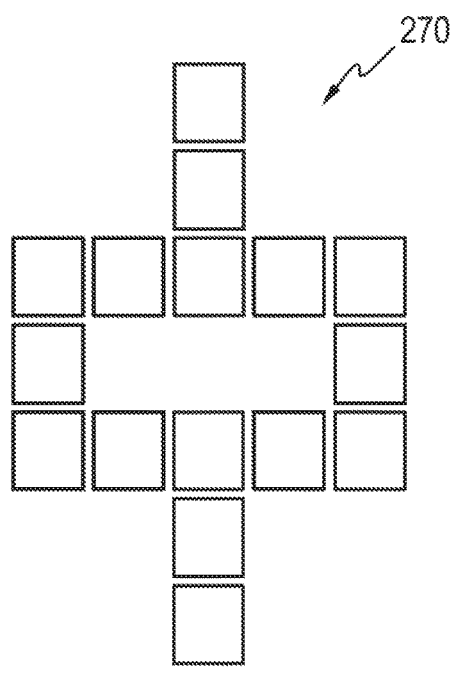
Figure 27B:
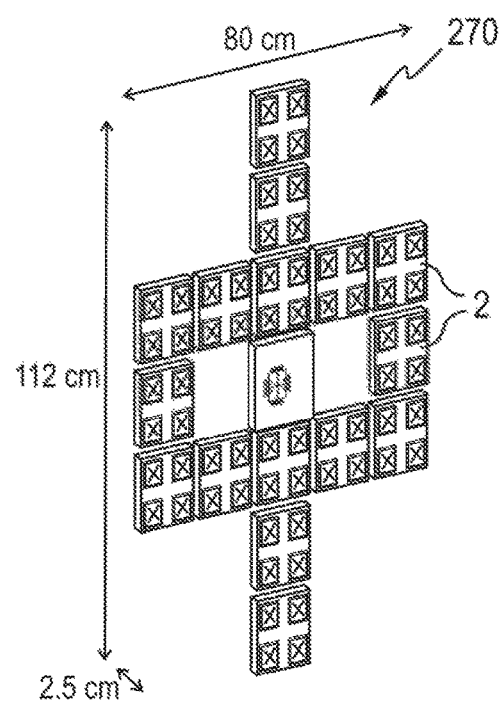

In another embodiment of the present invention the modular approach can be used in combination with illuminated signs are known for advertising purposes which consist of individual elements, each of these elements are equipped with LEDs. These elements are formed as so-called tiles. This embodiment is based on the idea to combine antennas especially for mobile communication with optically active surfaces, such as illuminated signs for luminous advertising, video walls, street lighting or the like, which are based on LED or OLED, or photovoltaic surfaces. FIG. 27a illustrates an illuminated sign of an advertising system consisting tiles with LEDs as known from the prior art, whereas FIG. 27b shows the combination with the present modular invention and an illuminate sign 270 of an advertising system consisting tiles with LEDs 271 and radio-subunits 2 of an antenna system. The radio-subunit is combined with optically active elements. The modular antenna system allows for building very thin panels. One application of those panels can be to integrate them into walls of buildings or to integrate them into illuminated signs. In this case, the modules can be equipped with strong light emitting diodes (LEDs). The advantage of this combined configuration is the integration of low power LEDs into the antenna structure in order to use the system not only for mobile communication but also for advertisement purposes. The radome then is designed to be translucent towards visible light. It may also be designed as a diffusor to first guide the light from the LEDs to the surface and then distribute the light evenly. Only few LED are required per tile, because using a light distributor 272 the illumination is sufficient. FIG. 28 shows a sandwich-structure of the divided system comprising the radio-module 22, the antenna-module 21 with LEDs 271 and a light distributor 272. And FIG. 29 shows a cross-sectional view of the mentioned system.

In another embodiment, the LEDs are controlled in brightness and color by a controller function that is part of the radio-subunit's FPGA. The control information is IP mapped, where the IP control channel is part of the CPRI protocol. The IP packets are conveyed to the radio-subunit.

Yet in another embodiment, multiple radio-subunits combined as a radio-unit are used to display changing patterns, pictograms or images.

REFERENCE NUMERICAL LIST

1 antenna element
11 antenna
2 radio-subunit
20 radio-unit
21 antenna-module
22 radio-module
23 optical connection
24 root-radio-subunit
3 transceiver
32 transmit and receive path
33 diplexer
34 Rx duplex filter
35 Tx duplex filter
36 low noise amplifier
37 Rx band filter
38 transceiver+ADC
39 Tx band filter
4 signal processing unit
40 power amplifier
41 Tx calibration signal
42 Rx calibration signal
43 Rx signal at the output of the transceiver
44 Tx signal at the input of the transceiver
45 duplexer
5 clock
51 clock synchonisation
6 Tx beam forming
7 Rx beam forming
8 Tx calibration
9 Rx calibration
10 interface to root-radio-subunit
11 interface to child-radio-subunit
12 Tx combiner and compensator
13 central hub
14 interface to base station
15 adder
16 splitter
17 coupler 18 multiplier
111 reference signal
112 locally generated reference signal
113 local reference receiver
114 local reference transmitter
115 reference signal generator
116 calibrated reference signal to child radio-subunits
117 correlator
118 switch
130 connector
131 parent connector
132 child connector
133 route-through connector
134 printed circuit board
135 child- or slave-radio-subunit
200 frame or backplane
201 connectors
202 ground plane
240 data and control switch
241 data and control switch bridge
242 controller
270 illuminated sign
271 light emitting diode, LED
272 light distributor, optical active element
500 CPRI multiplexer
501 beamforming layer
3000 general LSAS radio-unit
3001 optical transceiver cage
RSU-R root-radio-subunit
RSU-N node-radio-subunit
RSU-B branch-radio-subunit
RSU-L leave-radio-subunit
ISU interface-subunit

The invention claimed is:

1. A modular antenna system comprising:
   at least one radio-unit comprising at least two radio-subunits;
   each radio-subunit comprising a radio-module and/or an antenna-module;
   wherein said radio-module comprising a digital signal-processing unit, at least a transceiver, a front-end and a power amplifier;
   wherein the at least two radio-subunits provide an identical architecture and are mutually connected via a connector interface, and each radio-subunit has an IQ-input and an IQ-output; and
   wherein the IQ-input and the IQ-input of the radio-subunit are connected to at least one adjacent radio-subunit and the IQ-unit of a first root-radio-subunit (RSU-R) are connected to the base station via IQ-signal lines.

2. The modular antenna system according to claim 1, wherein the IQ-input and the IQ-output of each radio-subunit are connected to a base station.

3. The modular antenna system according to claim 1, further comprising an interface-subunit (ISU) connected to the root-radio-subunit (RSU-R).

4. The modular antenna system according to claim 1, wherein the root-radio-subunit comprises an FPGA boot image for supporting a hierarchical boot procedure of the radio-subunits.

5. The modular antenna system according to claim 1, wherein the radio-subunit is combined with optically active elements.

6. The modular antenna system according to claim 1, wherein the radio-subunit is connected to exactly one parent-radio-subunit and to n child-radio-subunits, with $n \geq 0$.

7. The modular antenna system according to claim 6, wherein the radio-subunit comprises a clock generator that serves as a clock slave for the parent-radio-subunit and serves as a clock master for the child-radio-subunits.

8. The modular antenna system according to claim 1, wherein the connector interface of the radio-subunit comprises parent-connectors, child-connectors and route-through connectors.

9. The modular antenna system according to claim 1, wherein the antenna-module comprises at least one antenna, and the antenna comprises at least one antenna element.

10. The modular antenna system according to claim 9, wherein the at least one antenna element of the antenna are cross-polarized.

11. The modular antenna system according to claim 9, wherein the at least one antenna elements of the antenna has a Vivaldi-structure.

12. A method for signal processing using the modular antenna system according to claim 1, wherein beamforming, calibration, clock and timer procedures are performed within a radio-subunit, and wherein the radio-subunit possesses a timer that is clocked by an integer multiple of a sample rate, wherein a sampling offset time calibration is preformed and a measured integer time offset is used to correct the timer, and a fractional time offset is compensated for by a fractional time correction block in the radio-subunit.

13. The method for signal processing according to claim 12, wherein an inter-calibration procedure is performed between modularly connected radio-subunits within a radio-unit to synchronize all locally generated reference signals with a reference signal received by a parent radio-subunit.

14. The method for signal processing according to claim 11, wherein an intra-calibration procedure is performed within a radio-subunit to synchronize all transceivers connected to antenna elements of the radio-subunit with a locally generated reference signal.

15. The method for signal processing according to claim 12, wherein
   in receive direction:
      the IQ-signals from all radio-subunits are weighted, aggregated and forwarded to the root-radio-subunit (RSU-R) and further forwarded to the base station;
   and in transmit direction:
      the IQ signals are replicated and forwarded to the radio-subunits.

* * * * *

UNITED STATES PATENT AND TRADEMARK OFFICE
CERTIFICATE OF CORRECTION

PATENT NO. : 10,224,642 B2
APPLICATION NO. : 15/311367
DATED : March 5, 2019
INVENTOR(S) : Aue et al.

Page 1 of 1

It is certified that error appears in the above-identified patent and that said Letters Patent is hereby corrected as shown below:

In the Claims

Column 21, Line 47: Claim 1, Delete "IQ-input and the IQ-input" and insert -- IQ-input and the IQ-output --

Column 21, Line 49: Claim 1, Delete "IQ-unit of" and insert -- IQ-input and the IQ-output of --

Column 22, Line 33: Claim 12, Delete "preformed" and insert -- performed --

Signed and Sealed this
Sixteenth Day of April, 2019

Andrei Iancu
*Director of the United States Patent and Trademark Office*